United States Patent [19]
Grundy

[11] Patent Number: 5,944,602
[45] Date of Patent: Aug. 31, 1999

[54] PORTABLE CLEANROOM CABINET ASSEMBLY

[75] Inventor: David A. Grundy, San Bruno, Calif.

[73] Assignee: TUMI Manufacturing, Inc., Fremont, Calif.

[21] Appl. No.: 08/925,919

[22] Filed: Sep. 9, 1997

[51] Int. Cl.[6] .................................................. F24F 3/16
[52] U.S. Cl. ................ 454/187; 55/385.2; 312/293.3; 312/351; 454/57; 16/266
[58] Field of Search .................. 454/57, 187; 55/385.2; 312/31, 351, 293.3, 326, 329; 16/266

[56] References Cited

U.S. PATENT DOCUMENTS

| | | | |
|---|---|---|---|
| 971,647 | 10/1910 | Vanderveld | 312/351 X |
| 2,564,473 | 8/1951 | Ferguson | 312/351 X |
| 2,612,272 | 9/1952 | Cobbs | 312/351 X |
| 2,963,734 | 12/1960 | Huget | 16/266 |
| 3,352,431 | 11/1967 | Smith | 312/351 X |
| 3,487,766 | 1/1970 | Wood | 454/187 |
| 4,100,847 | 7/1978 | Norton | 454/57 |
| 4,409,889 | 10/1983 | Burleson | 55/385.2 X |
| 4,660,464 | 4/1987 | Tanaka | 454/187 |
| 4,705,444 | 11/1987 | Tullis et al. | 414/226 |
| 4,724,874 | 2/1988 | Parikh et al. | 141/98 |
| 5,024,329 | 6/1991 | Grohrock | 206/454 |
| 5,240,320 | 8/1993 | Yerman | 312/293.3 X |
| 5,255,783 | 10/1993 | Goodman et al. | 206/334 |
| 5,482,161 | 1/1996 | Williams et al. | 206/711 |
| 5,522,767 | 6/1996 | Bertsche et al. | 454/57 X |
| 5,711,705 | 1/1998 | Krainiak et al. | 55/385.2 X |

FOREIGN PATENT DOCUMENTS

94/17336  8/1994  WIPO ................................ 454/187

OTHER PUBLICATIONS

"PureFlow™ Mobile Storage System," Mobile Storage, Terra Universal, Inc., Anaheim, CA, pp. 204 and 205.

*Primary Examiner*—Harold Joyce
*Attorney, Agent, or Firm*—Beyer & Weaver, LLP

[57] ABSTRACT

A portable cleanroom cabinet (20) having a portable cabinet device (22), configured for mobile transport, which provides a cavity (23) formed for receipt of at least one electronic component (21) therein. The cabinet device (22) defines at least one air flow passage (32) having a first opening (33) in flow communication with an upstream end (29) of the cavity (23), and a second opening (35) in flow communication with an opposite downstream end (36) of the cavity (23). Collectively, these passages and cavities define a recirculating airflow pathway such that substantially all the air flowing through the cavity (23) from the upstream end (29) to the downstream end (36) thereof recirculates back through the air flow passage (32) to the upstream end (29). A blower assembly (30) is provided communicably coupled to the recirculating airflow pathway to drive the recirculating air flow, and a filter element (31) positioned in the recirculating airflow path such that the recirculating air flows through the filter element (31) prior to entering the cavity (23). The flow of recirculating air through the cavity (23) from the upstream end (29) to the downstream end (36) is substantially evenly distributed across a transverse cross-sectional dimension thereof.

70 Claims, 18 Drawing Sheets

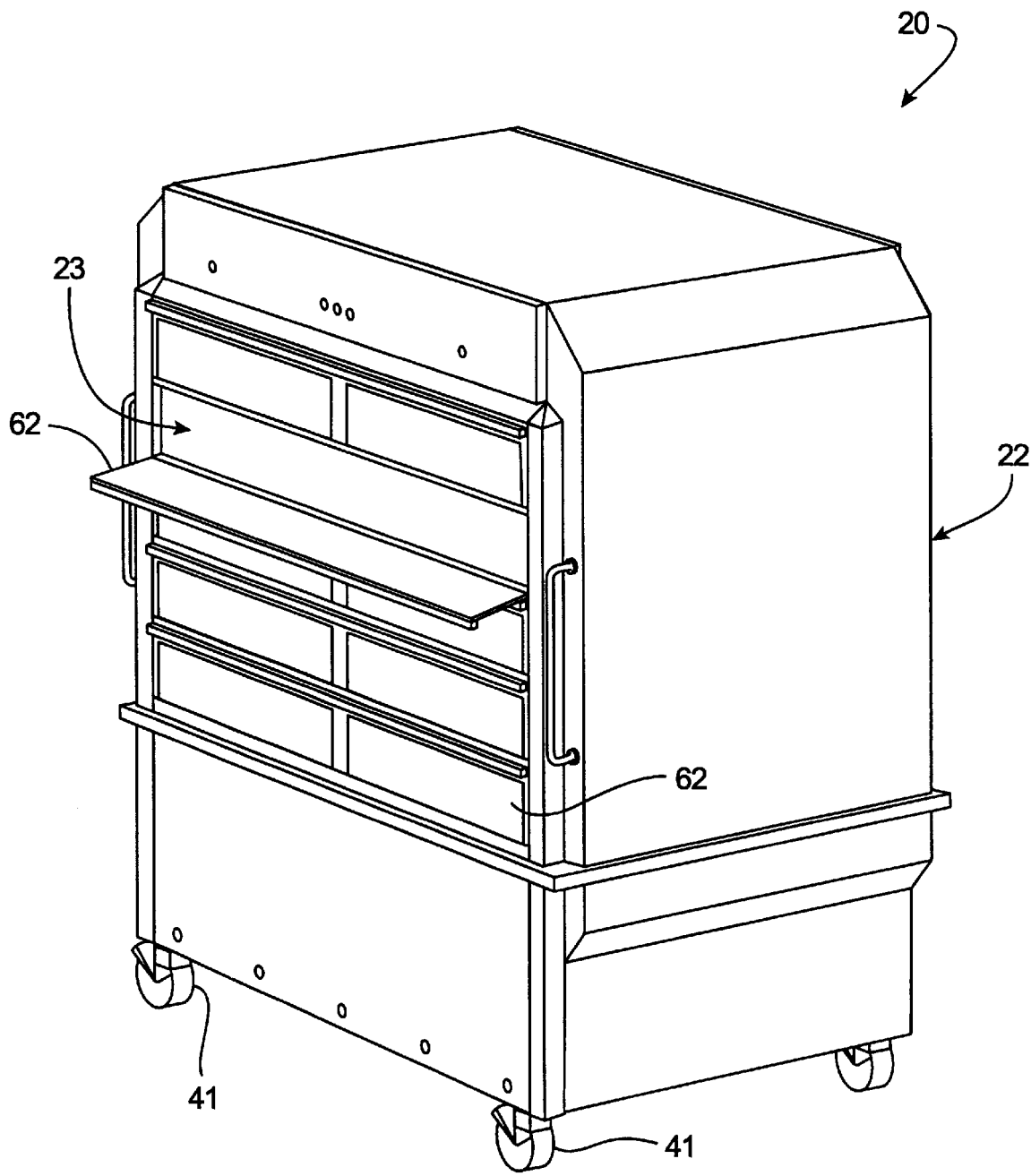
FIG._1

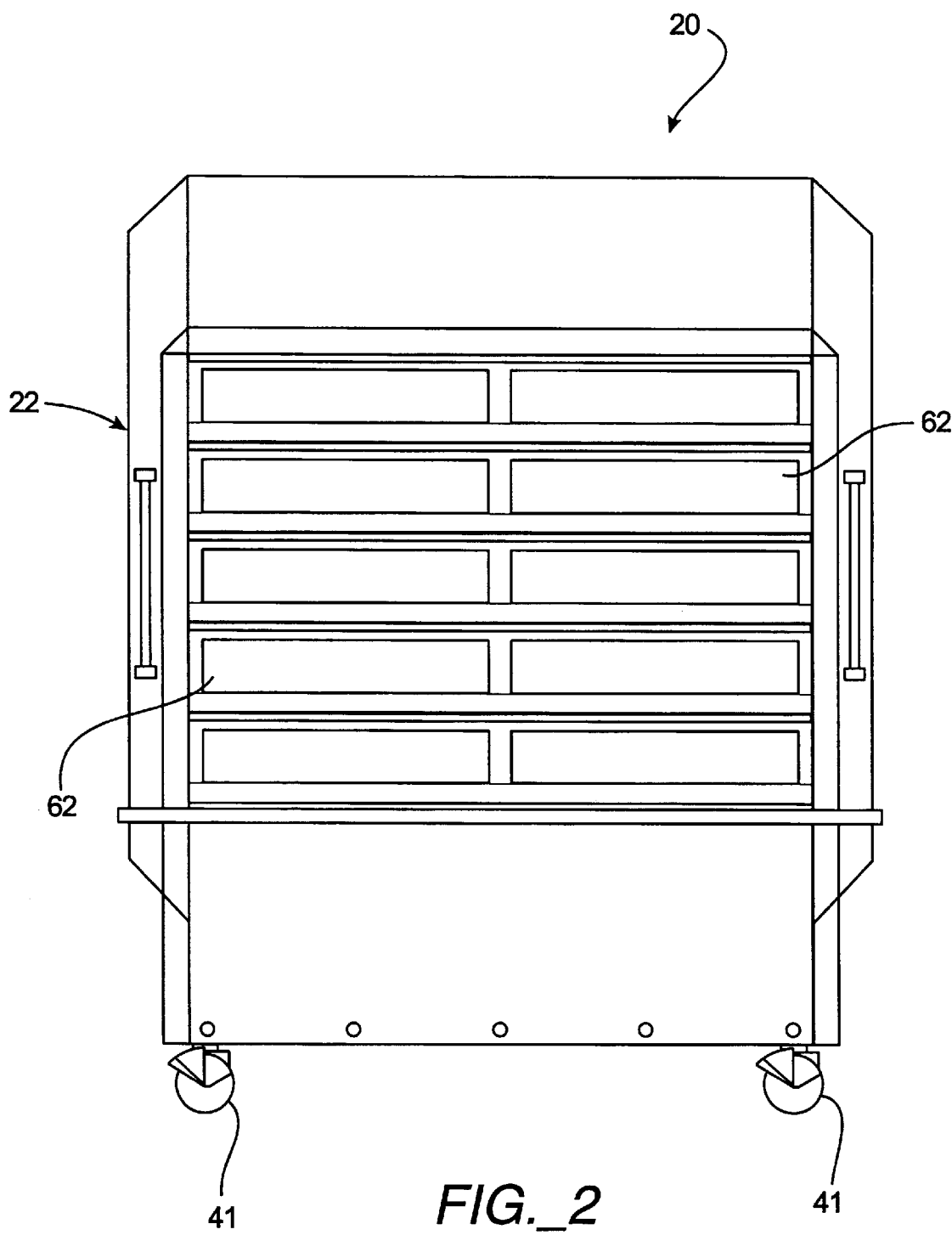
FIG._2

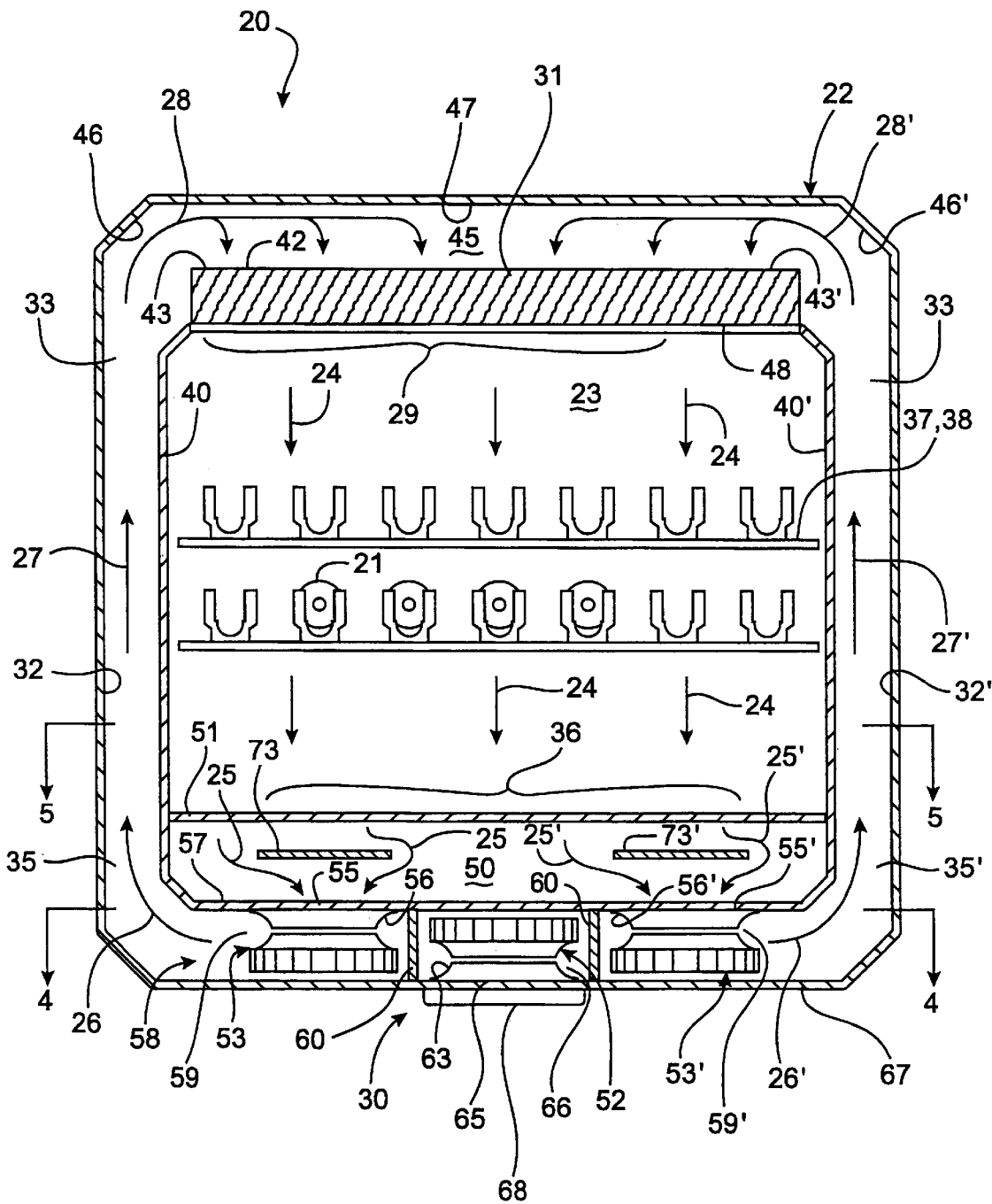
FIG._3

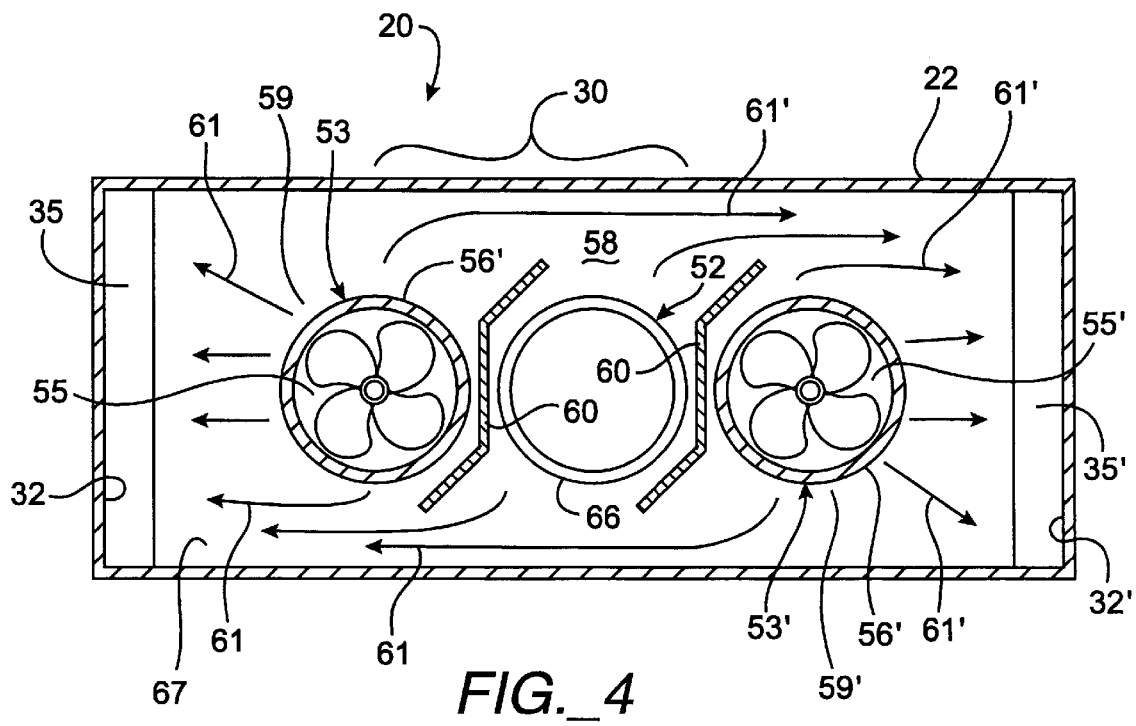
FIG._4
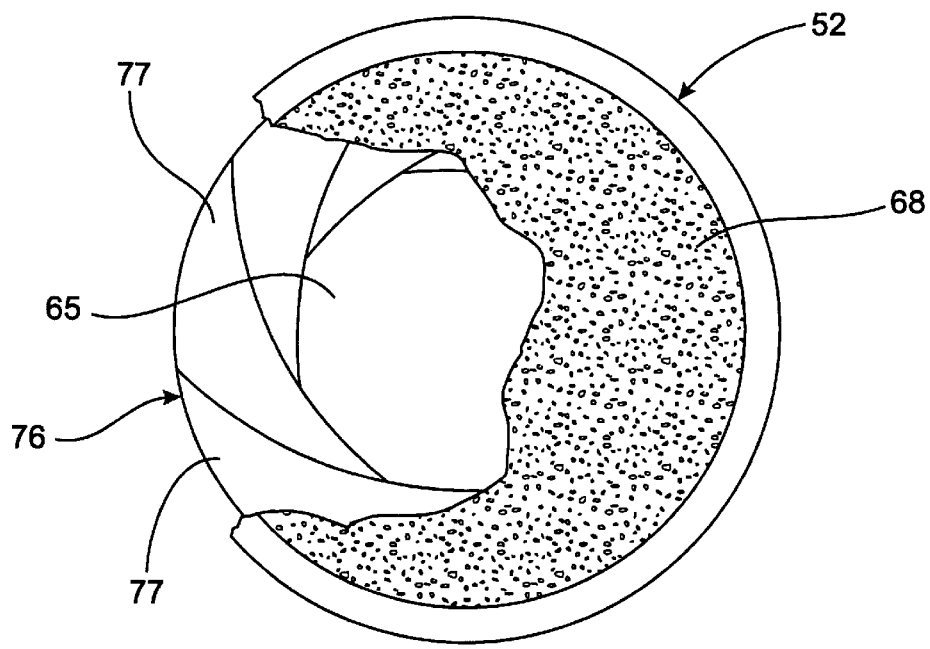
FIG._6

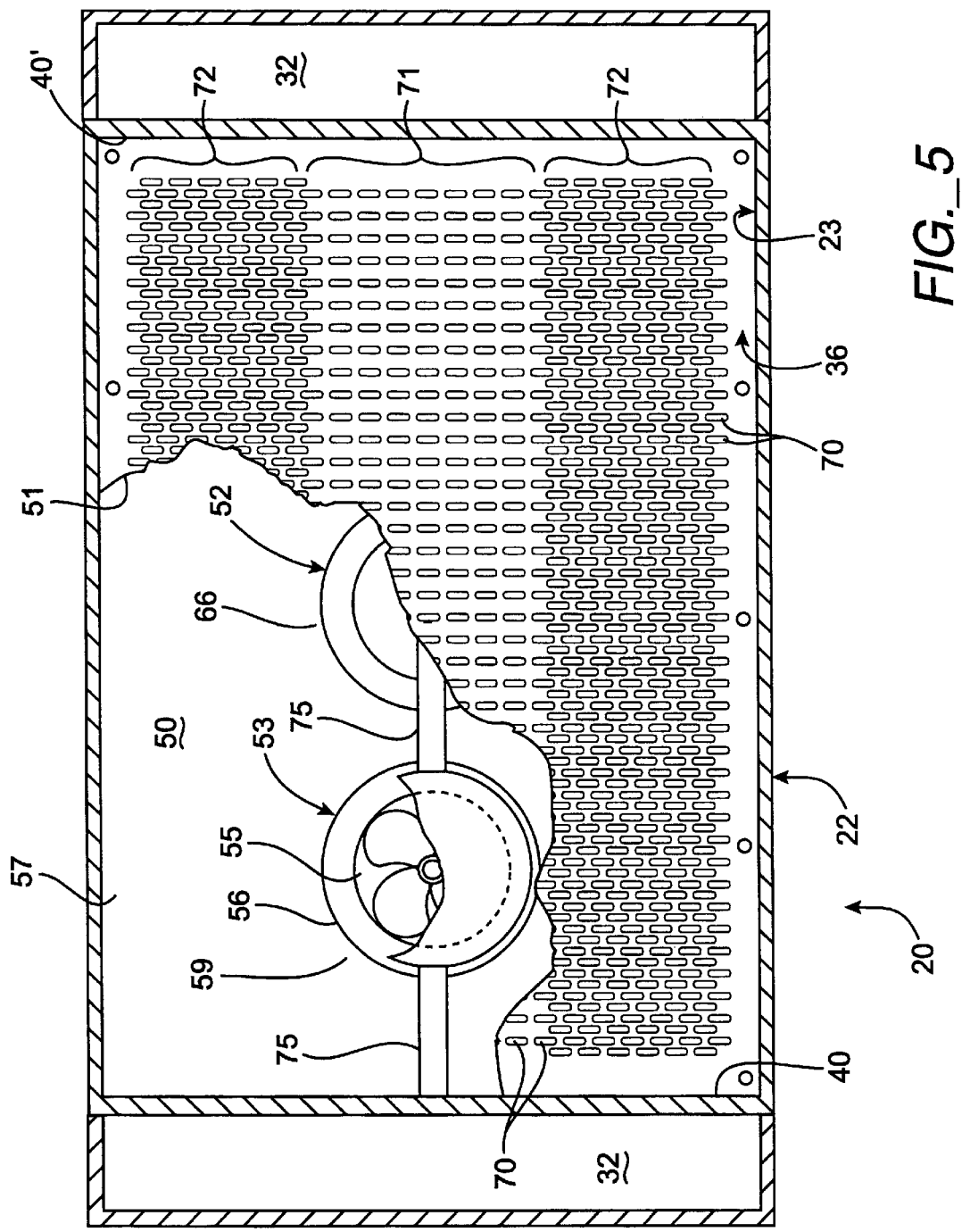
FIG._5

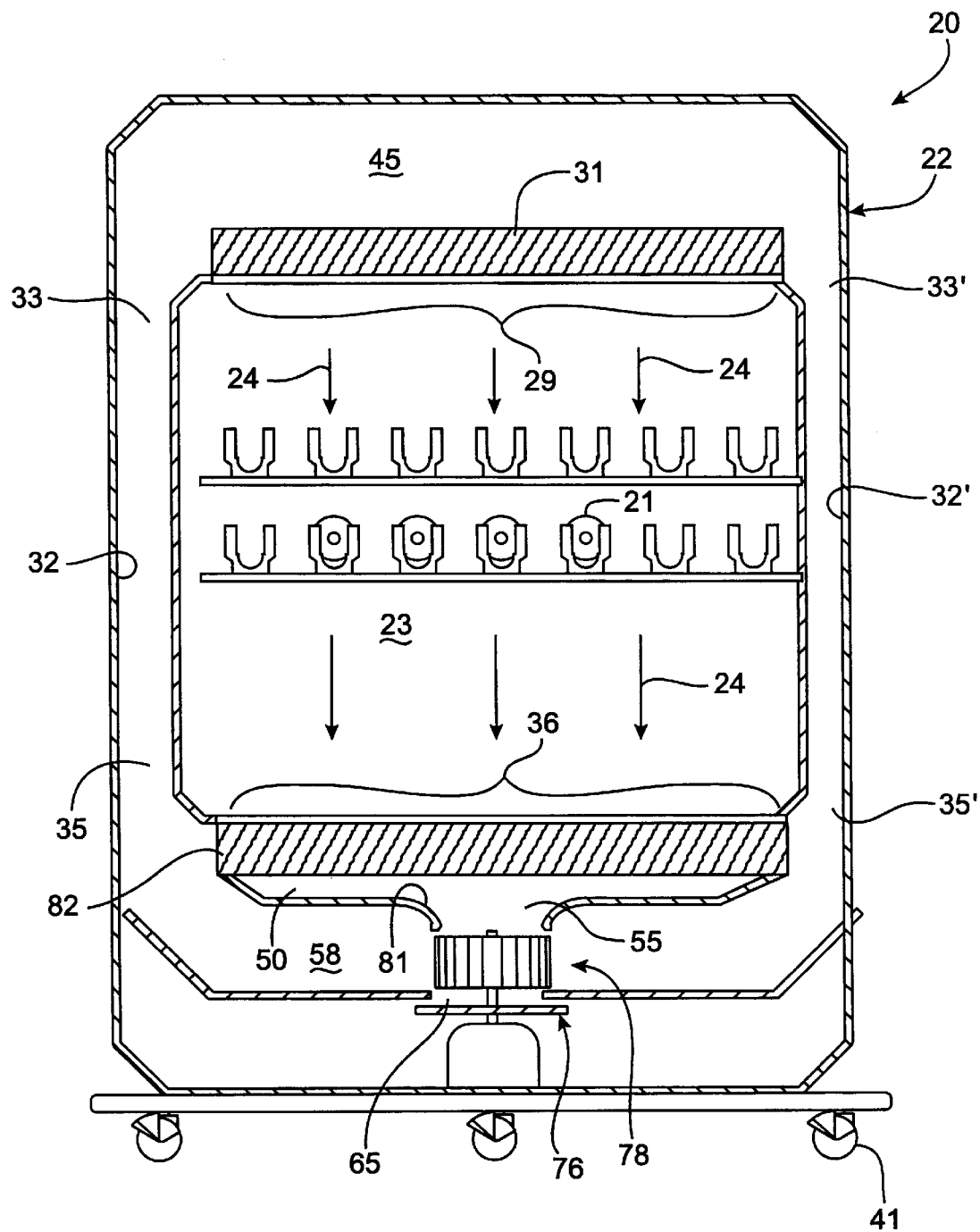
FIG._7

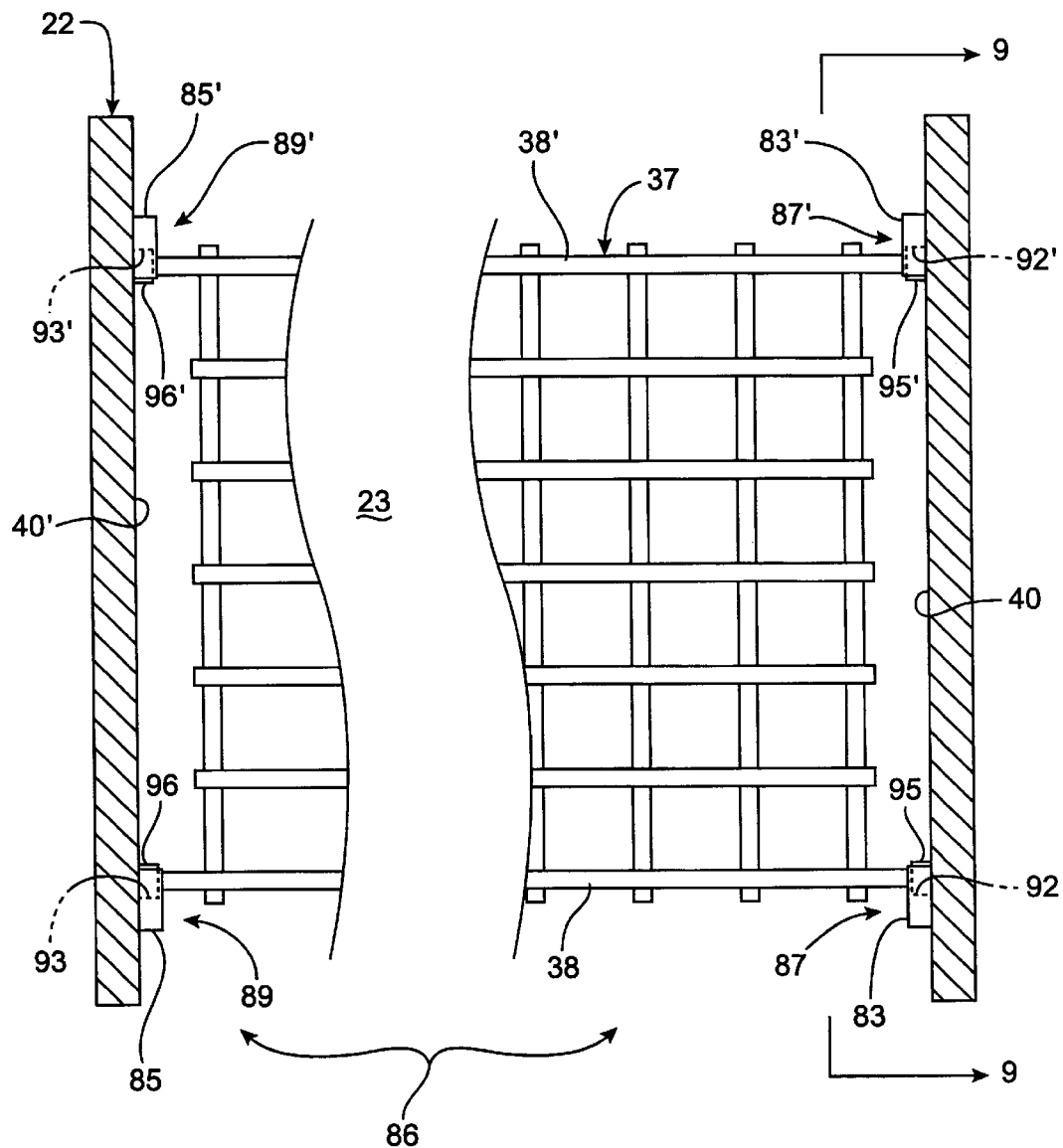
FIG._8

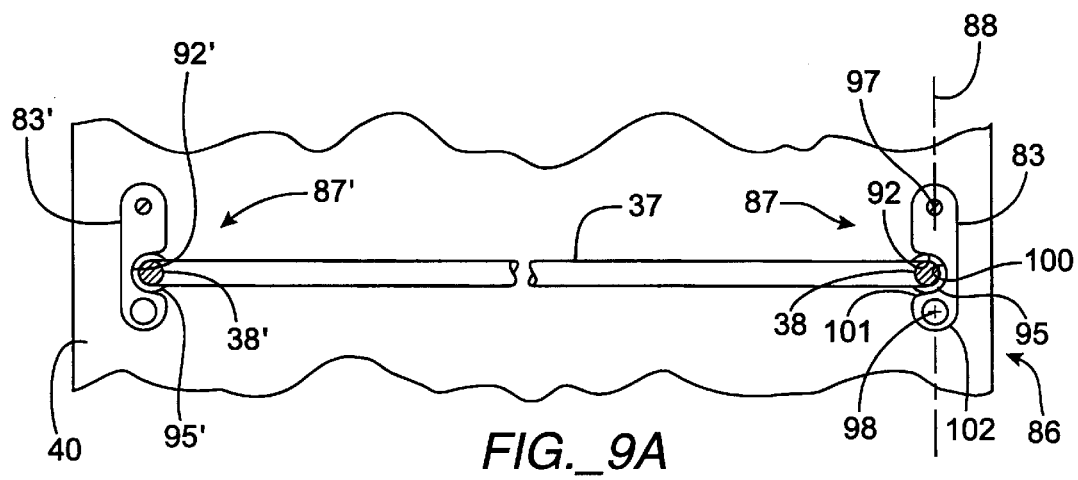
FIG._9A
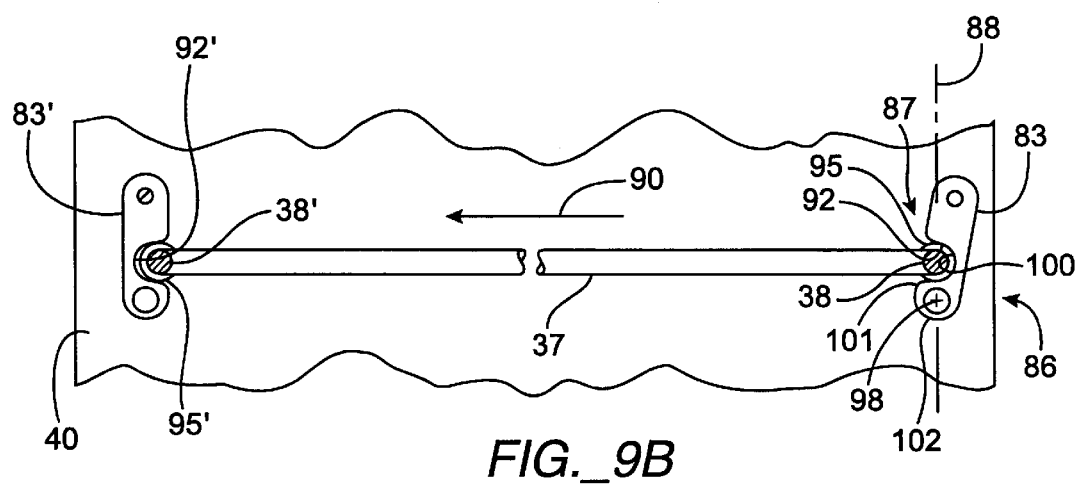
FIG._9B
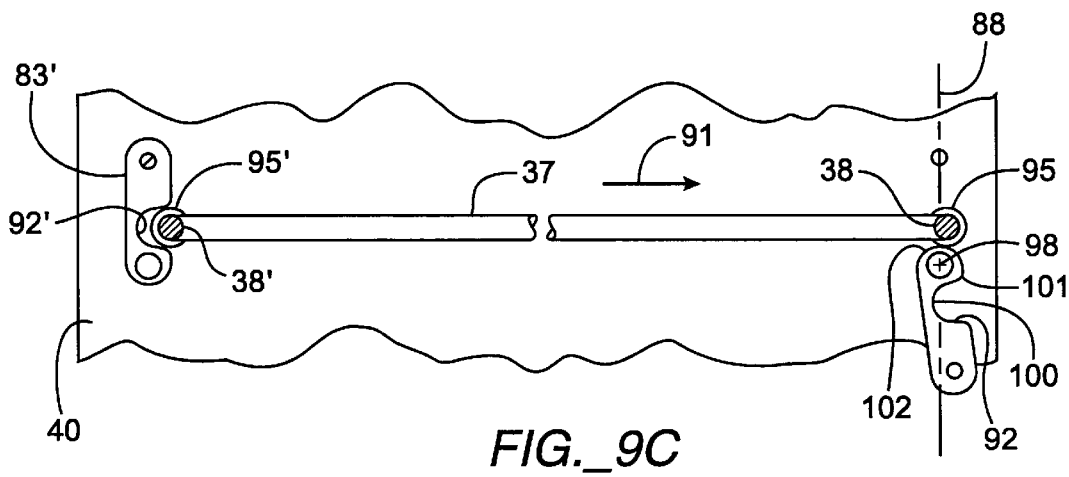
FIG._9C

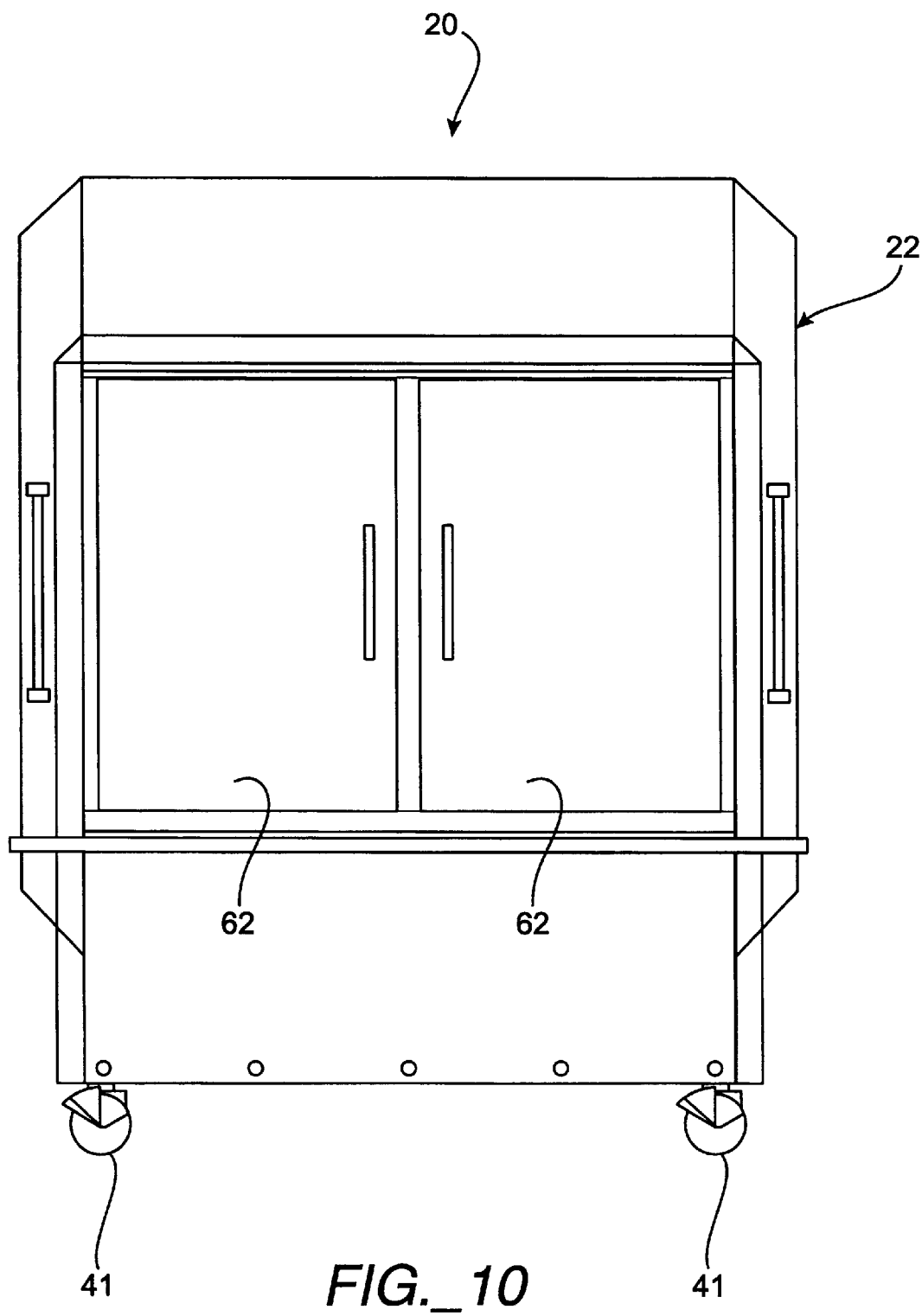
FIG._10

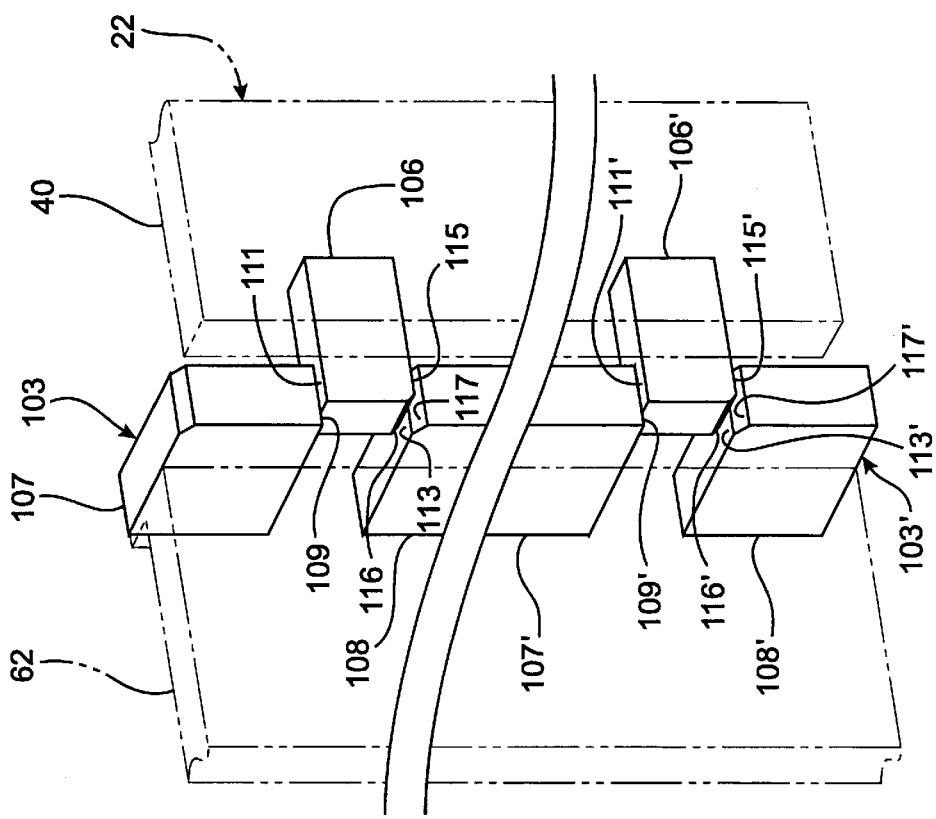
FIG._11B
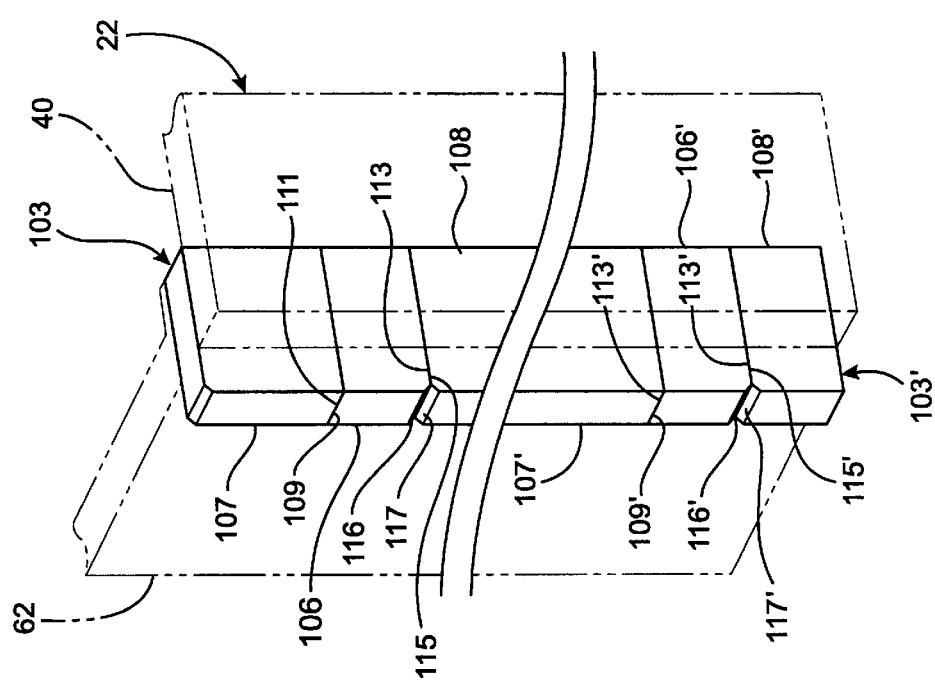
FIG._11A

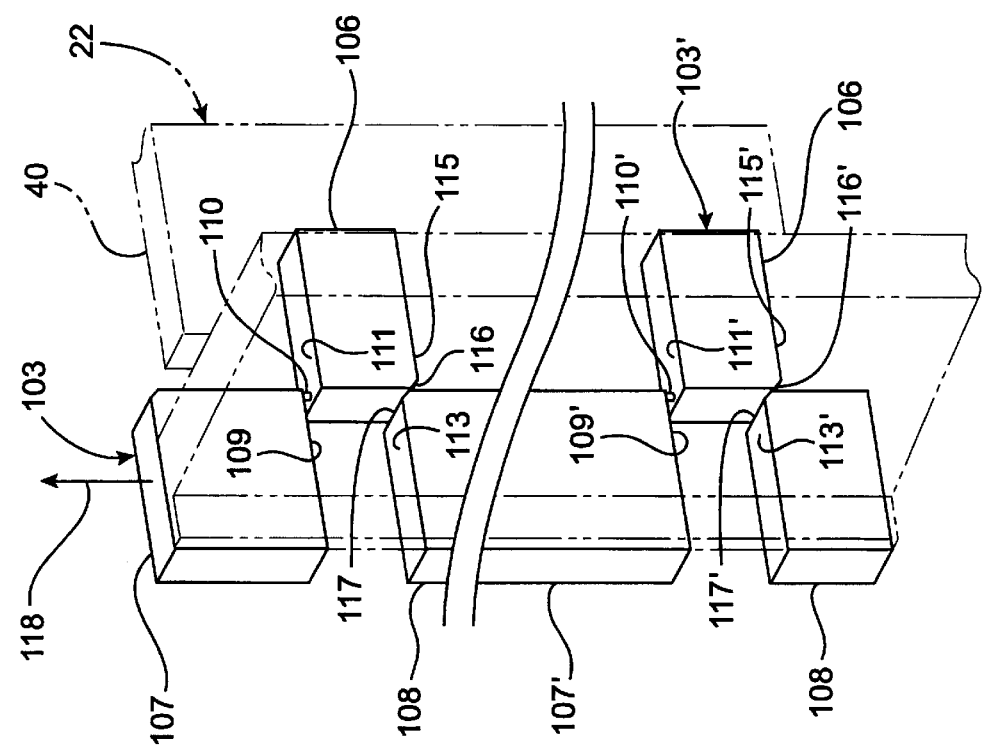
FIG._11D
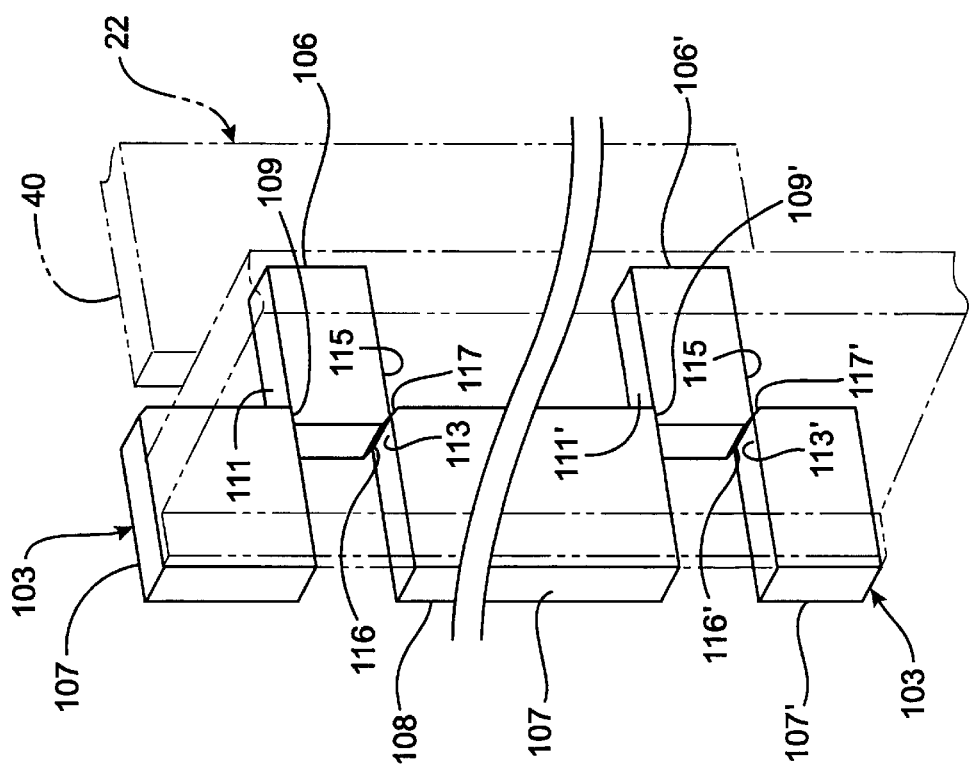
FIG._11C

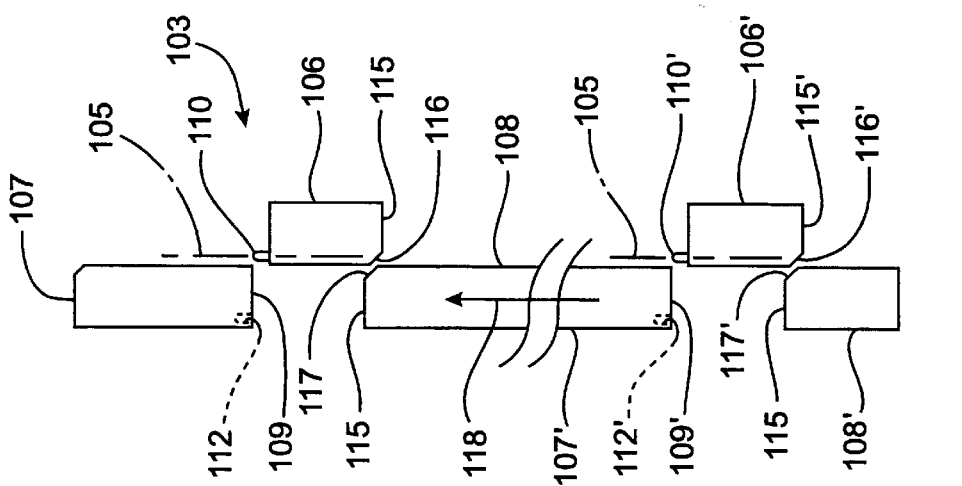
FIG. _12C
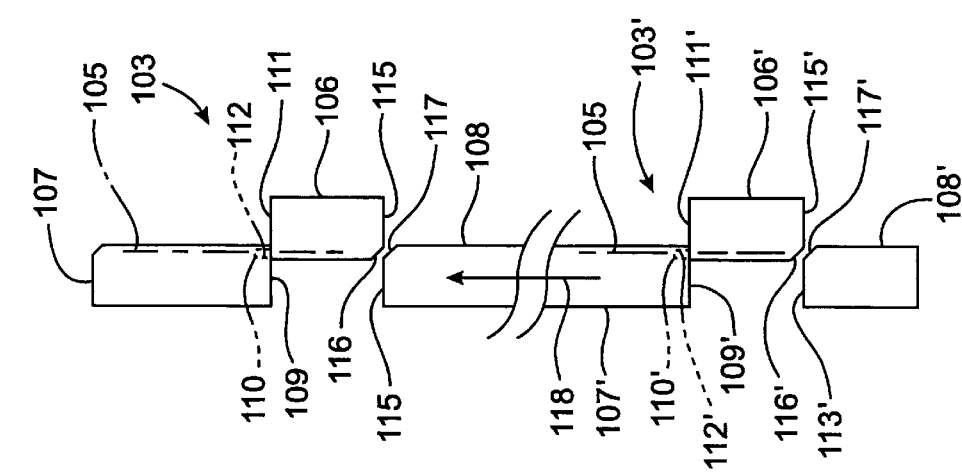
FIG. _12B
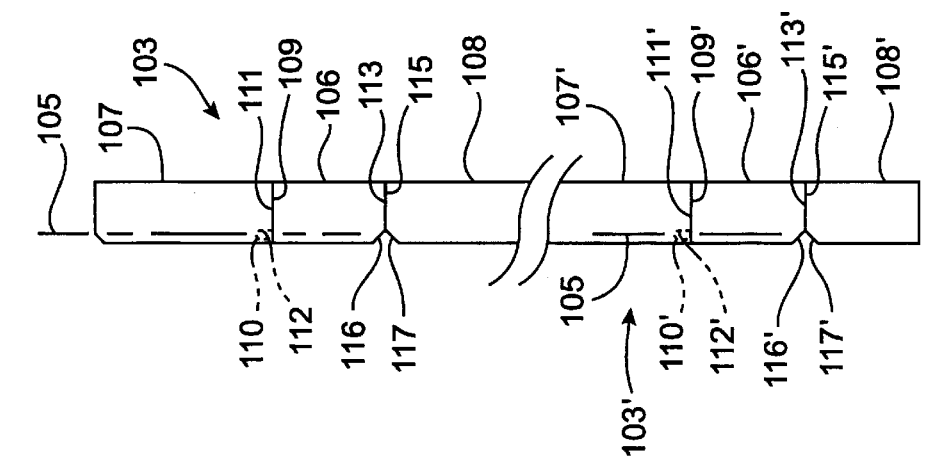
FIG. _12A

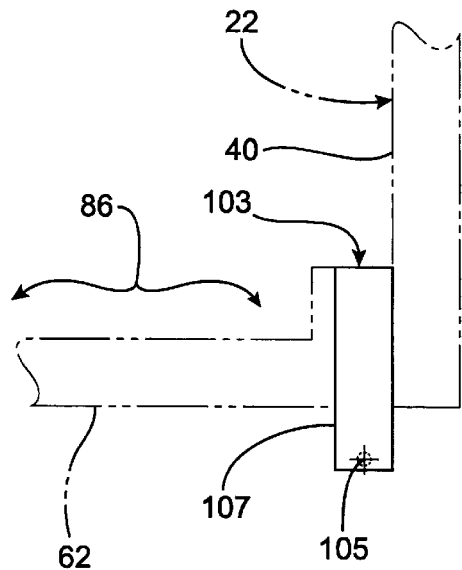
FIG._13A
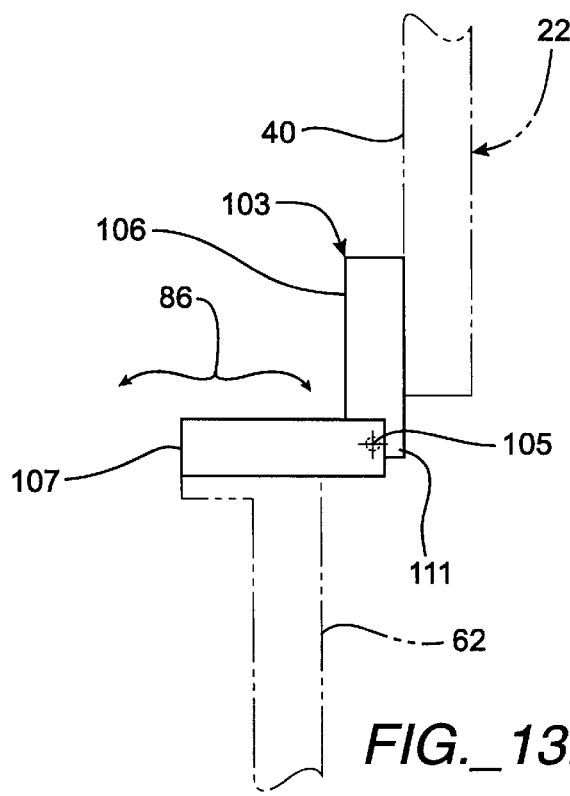
FIG._13B
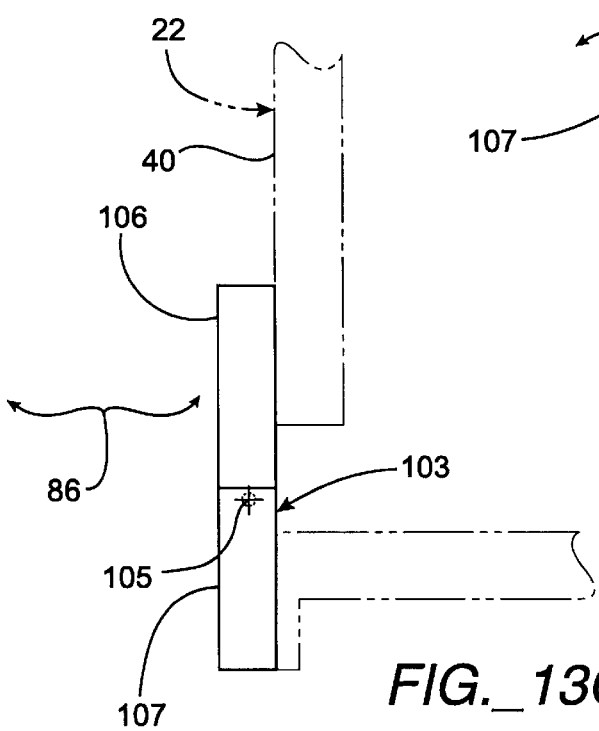
FIG._13C

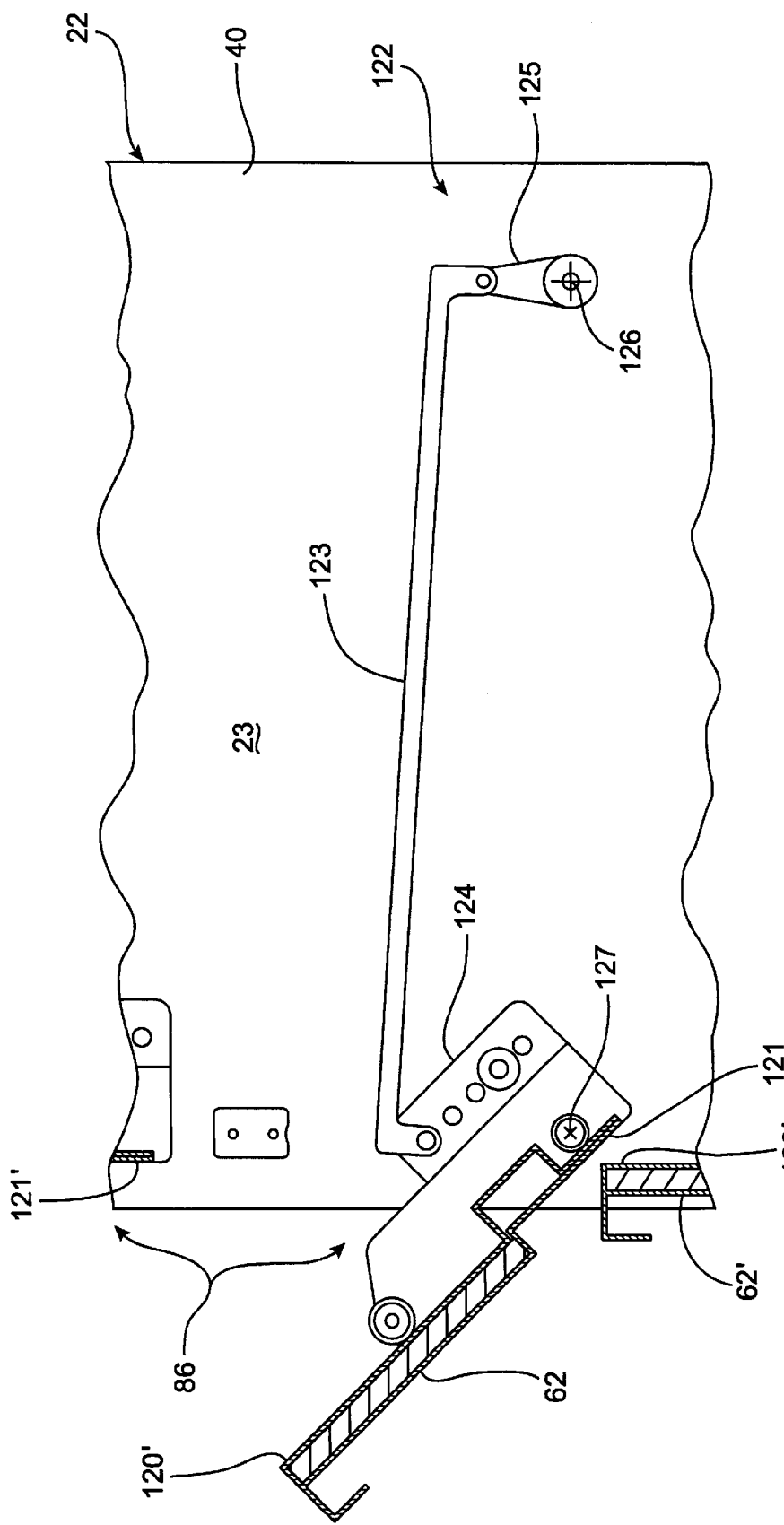
FIG._14B

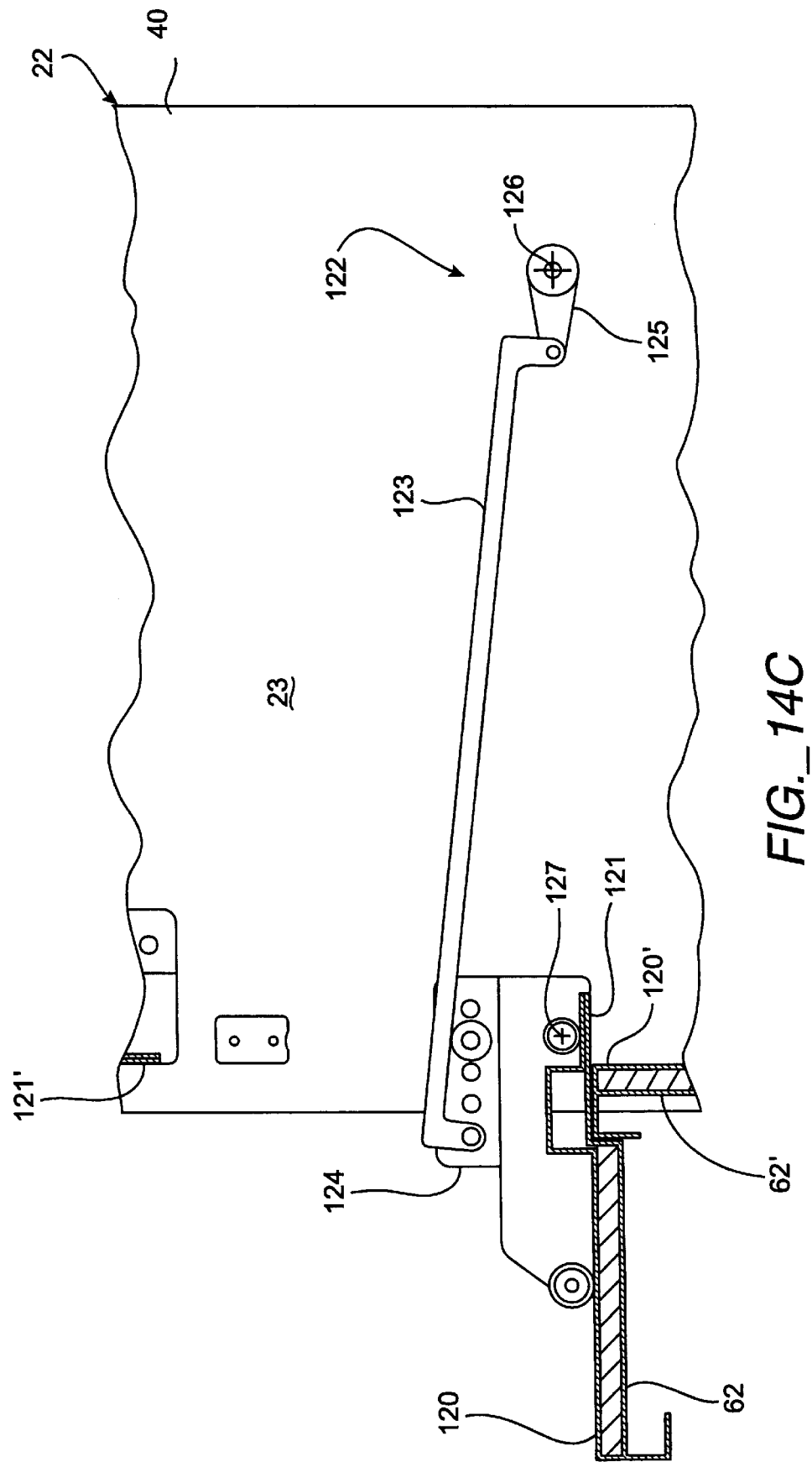

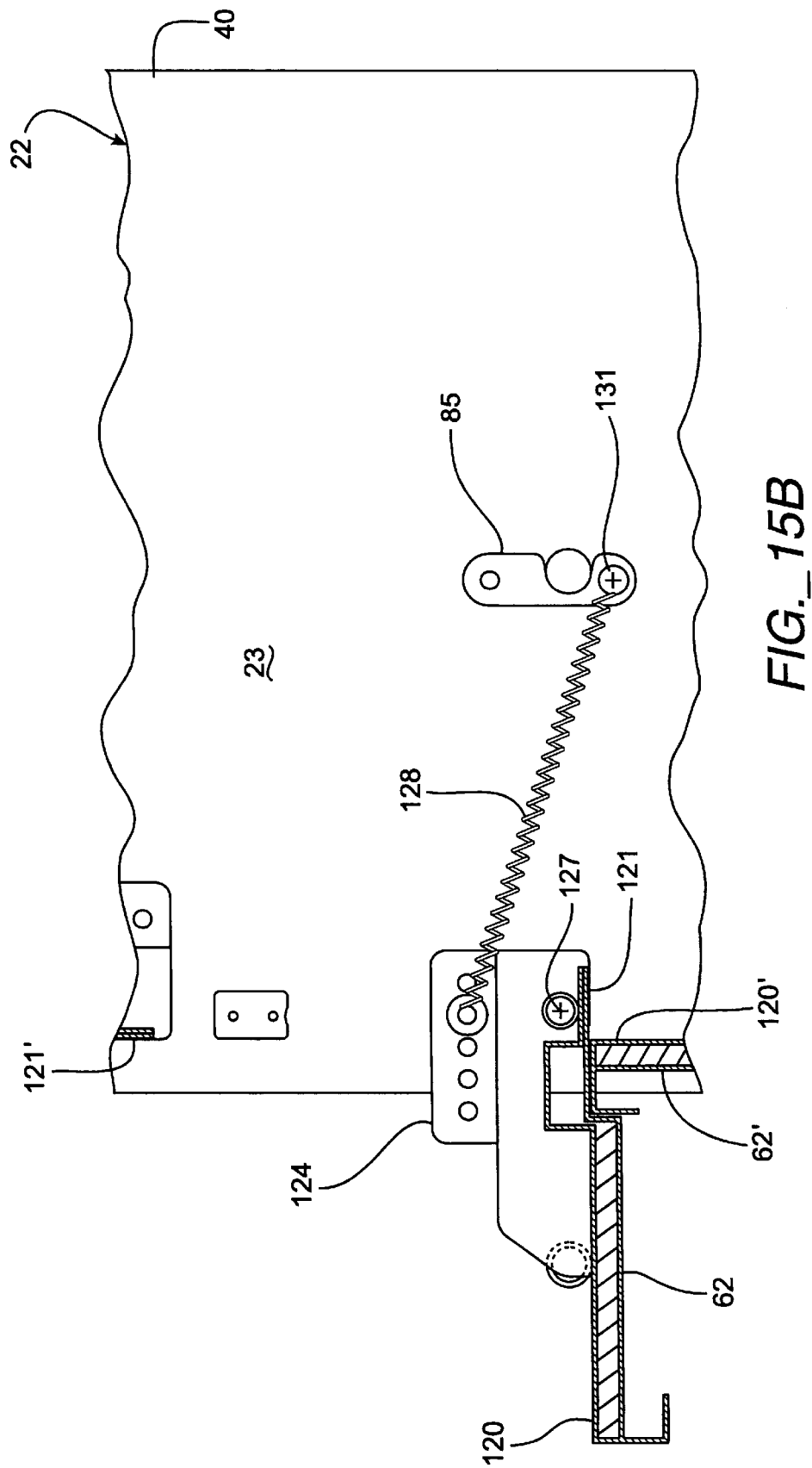
FIG._15B

PORTABLE CLEANROOM CABINET ASSEMBLY

TECHNICAL FIELD

This present invention relates, generally, to mobile storage assemblies, and, more particularly, relates to self-contained, portable cleanroom assemblies adapted to recirculate the airflow therein.

BACKGROUND ART

The continued trend in the electronics industry, as technology advances, is toward increased circuit board densities motivated by the need for smaller, thinner integrated circuit (IC) packages. As a result, the fabrication of these IC packages becomes increasingly difficult due to the decreased spacing between adjacent circuits. The presence or generation of undesirable contamination particles (such as dust particles or moisture droplets as small as 0.10 micrometers and above) during the manufacturing and processing of integrated circuits can often cause physical defects or other quality control problems. This is especially problemsome in semiconductor manufacture, for example, where semiconductor wafer processing geometries can approach 0.1 micrometer and below with line widths of 0.35 microns.

In the disk drive industry, disk drive platters have continued to diminish in size while at the same time offered increased storage capacity. These advancements are due in part to substantially increased track densities. Similar to IC fabrication, undesirable contamination particles during the manufacturing and processing of these disks pose significant physical defect or other quality control problems.

Accordingly, typical processing environments for semiconductors, disk drives or other particle contamination sensitive electronic components utilize standardized "clean room" techniques. Depending upon the cleanroom classification, these rooms primarily rely on filtering techniques, as well as other devices, to continuously remove particles having geometries of about 0.10 micrometers or larger. More recently, standardized mechanical interface (SMIF) systems have been integrated into the fabrication techniques of integrated circuits, disk drives and other electronic components to further reduce particle contamination which may be introduced during storage, transport or transfer between processing steps. By mechanically minimizing the volume of gaseous media surrounding the semiconductor wafers during fabrication, the SMIF system insures that much of this gas is essentially stationary relative the wafers, and that the contaminant particles from the exterior "ambient" environment cannot enter the wafer environment.

While SMIF systems have substantially reduced particle contamination, and thus, improved semiconductor or disk drive fabrication, these components often still require manual manipulation at some time between fabrication processes. As is generally the case, different processes associated with a particular fabrication machine require different processing times. Moreover, when problems develop along one stage of the fabrication process, the whole or part of the fabrication process may be shut down. The electronic components which may be at differing stages of the fabrication process, accordingly, will likely require temporary storage in cassette-type devices until further processing can be continued. Unfortunately, it is extremely difficult to maintain these large clean room environments virtually free of 0.1 micrometer sized particles or less due to the constant presence of people and operating machinery within the clean room. Contamination particles eventually come to rest upon the storage cassettes which may become dislodged upon handling thereof.

To address this problem, mobile storage systems have thus been developed to temporarily store electronic components therein which a re sensitive to particle contamination during manufacture and processing. These units are essentially mini-cleanroom storage facilities designed to store and transport a plurality of these cassettes which support the electronic components therein. Since these mobile storage systems are self-contained, they may be employed either internally in the cleanroom from one fabrication station to the next, or externally from cleanroom-to-cleanroom.

Typically, these portable facilities provide a storage cabinet having a rectangular-shaped cavity wherein a plurality of vertically-spaced stainless steel wire shelves are provided extending horizontally across the cavity therein. A blower assembly is positioned on top of the storage cabinet which generates a downdraft flowing through the cavity from an upper portion of the cavity to a bottom portion thereof. Positioned between the blower assembly and the upper portion of the cavity is a filter device extending transversely across the cavity so that the airflow generated by the blower assembly passes through the filter before flowing through the cavity. The filtered air is then vented out of the bottom of the cavity through a screen device and into the surrounding environment. One such device typical in this field is the PUREFLOW™ mobile storage system by Terra Universal Inc.

While these mobile storage systems perform satisfactorily under most circumstances, several problems are inherent with this design. For one, it is highly desirable to prolong the life of the filter elements due to the costs associated with replacement. Typically, the HEPA or ULPA filters employed in these systems are more than $200.00 to replace. Depending upon the cleanroom classification which the storage system resides (i.e., from class 100 to class 1) the life of the filter can vary drastically. In the worst case scenario where the mobile storage unit is transferred between cleanrooms, the filter element may require replacement at least once every couple of months or in some cases even weeks.

Another problem associated with this design is that due to the top mounted blower assembly, the relative height of these units is increased which reduces the ease of maneuverability and storage. Moreover, the weight of the upper mounted blower assembly together with the overall height increase raises the center of gravity of the unit. As a result, the stability of the mobile storage system is further compromised.

Moreover, these flow-through open systems are difficult to pressurize since the system must be choked to generate an adequate pressurization. Thus, these designs require more blower power to increase pressurization of the storage cavity. As a result, the battery run time is substantially reduced during true mobile operation.

Finally, these units are very noisy to operate due to the flow through design. The lack of baffling enables the blower noise to be directly emitted from the bottom of the unit. This is especially problemsome in the closed confines of smaller cleanrooms.

DISCLOSURE OF THE INVENTION

Accordingly, it is an object of the present invention to provide a mobile storage assembly capable of cleanroom class storage and mobility during the fabrication of particle sensitive electronic components.

Another object of the present invention is to provide a mobile storage assembly which increases the usable life of the filter elements.

Yet another object of the present invention is to provide a mobile storage assembly which recirculates the cavity air therein.

Still another object of the present invention is to provide a mobile storage assembly which is quieter to operate.

Another object of the present invention is to provide a mobile storage assembly which can be easily reconfigured for an ever changing/evolving fabrication environment.

It is yet a further object of the present invention to provide a mobile storage assembly having a lower center of gravity.

Yet another object of the present invention is to provide a mobile storage assembly which increases operating efficiency for increased battery life.

It is a further object of the present invention to provide a mobile storage assembly which is durable, compact, easy to maintain, has a minimum number of components, can be used by unskilled personnel and is economical to manufacture.

In accordance with the foregoing objects, one embodiment of the present invention provides a portable cleanroom cabinet assembly for the transport of at least one electronic component. The cabinet assembly includes a portable cabinet device configured for mobile transport, and defining a cavity formed for receipt of the at least one component therein. The cabinet further defines at least one air flow passage having a first opening in flow communication with an upstream end of the cavity, and a second opening in flow communication with an opposite downstream end of the cavity. Collectively these passages and cavities define a recirculating airflow pathway such that substantially all the air flowing through the cavity from the upstream end to the downstream end thereof recirculates back through the air flow passage to the upstream end. The present cabinet assembly further includes a blower assembly communicably coupled to the recirculating airflow pathway to drive the recirculating air flow, and a filter element positioned in the recirculating airflow path such that the recirculating air flows through the filter element prior to entering the cavity. The flow of recirculating air through the cavity from the upstream end to the downstream end is substantially evenly distributed across a transverse cross-sectional dimension thereof.

The present invention cabinet assembly further preferably includes an accumulation chamber positioned between the upstream end of the cavity and the respective first openings of the pair of air flow passages to accumulate a reservoir of the recirculating air therein prior to passing into the cavity. By specially configuring and positioning the accumulation chamber adjacent to and generally linearly upstream from the upstream end of the cavity, the pressure distribution of the accumulated air in the accumulation chamber is configured to substantially evenly distribute the pressure of the accumulated air therein, laterally across the transverse cross-sectional dimension of the cavity upstream end and prior to entering the cavity, to provide an even flow distribution of the recirculating air therethrough.

A collection chamber is also preferably provided positioned between the downstream end of the cavity and the second opening of the air flow passage to accumulate a reservoir of diffused air therein after the recirculating air exits the cavity upstream end and before being drawn into an intake portion of the blower assembly. The collection chamber is further positioned adjacent to and generally linearly downstream from the downstream end of the cavity.

Preferably, the blower assembly is positioned between the collection chamber and the second opening of air flow passage. The blower assembly is preferably provided by a pressure blower, and two independent recirculating blowers positioned on opposite sides of the pressure blower. The pressure blower is in selective communication between the ambient air outside of the recirculating airflow pathway and the recirculating air to generate a positive pressure relative the ambient air, while each recirculating blower is configured to drive the recirculating air flow.

The portable cleanroom cabinet assembly of the present invention further preferably includes a shelf positioned in the cavity and configured to extend from one side of cavity to the other side thereof. A bracket device cooperates with the shelf for selective movement of the bracket device between a first stable condition and a second stable condition. In the first stable condition, the bracket device supportably locks the shelf to the interior walls defining the cavity; and in the second stable condition, the bracket device enables removal of the shelf from an access opening into the cavity. The shelf and the bracket device cooperate to provide a bi-stable, over-center, linkage assembly movable between and biased toward both of: (i) a first stable condition on one side of a linkage assembly centerline when the bracket device is in the first stable condition; and (ii) a second stable condition on an opposite side of the centerline when the side bracket device is in the second stable condition.

BRIEF DESCRIPTION OF THE DRAWINGS

The assembly of the present invention has other objects and features of advantage which will be more readily apparent from the following description of the Best Mode of Carrying Out the Invention and the appended claims, when taken in conjunction with the accompanying drawing, in which:

FIG. 1 is a top perspective view of a portable cleanroom cabinet assembly constructed in accordance with the present invention.

FIG. 2 is a front elevation view of the portable cleanroom cabinet assembly of FIG. 1.

FIG. 3 is an enlarged, front elevation view, in cross-section, of the portable cleanroom cabinet assembly of FIG. 1 illustrating the air flow recirculation path.

FIG. 4 is a top plan view, in cross-section, of the portable cleanroom cabinet assembly taken substantially along the plane of the line 4—4 in FIG. 3 illustrating the blower assembly and the baffle panels.

FIG. 5 is a top plan view, in cross-section, of the portable cleanroom cabinet assembly taken substantially along the plane of the line 5—5 in FIG. 3 illustrating the diffuser plate through-flow pattern.

FIG. 6 is an enlarged, bottom plan view, partially broken-away, of the intake end of a pressure blower of the blower assembly having an adjustable flow device.

FIG. 7 is an enlarged, front elevation view, in cross-section, of an alternative embodiment portable cleanroom cabinet assembly having a single fan assembly.

FIG. 8 is an enlarged, fragmentary, top plan view of a shelf bracket of the portable cleanroom cabinet assembly of FIG. 1.

FIGS. 9A–9C are fragmentary, side elevation views illustrating the operation of the shelf bracket taken substantially along the plane of the line 9—9 in FIG. 8.

FIG. 10 is a top perspective view of an alternative embodiment portable cleanroom cabinet assembly having vertically operating doors.

FIGS. 11A–11D are enlarged, fragmentary, top perspective views of a hinge device for the vertically operating doors of FIG. 10, and illustrating the operation thereof.

FIGS. 12A–12C are fragmentary side elevation views of the hinge device corresponding to FIGS. 11A, 11C and 11D, respectively.

FIGS. 13A–13C are fragmentary top plan views of the hinge device corresponding to FIG.11A–11C, respectively.

FIGS. 14A–14C are enlarged, fragmentary, side elevation views of the operation of an alternative embodiment horizontally operating doors having an actuating arm for automatic control thereof.

FIGS. 15A and 15B are enlarged, fragmentary, side elevation views illustrating the operation of the spring biased horizontally operating doors.

BEST MODE OF CARRYING OUT THE INVENTION

Figure 14A:
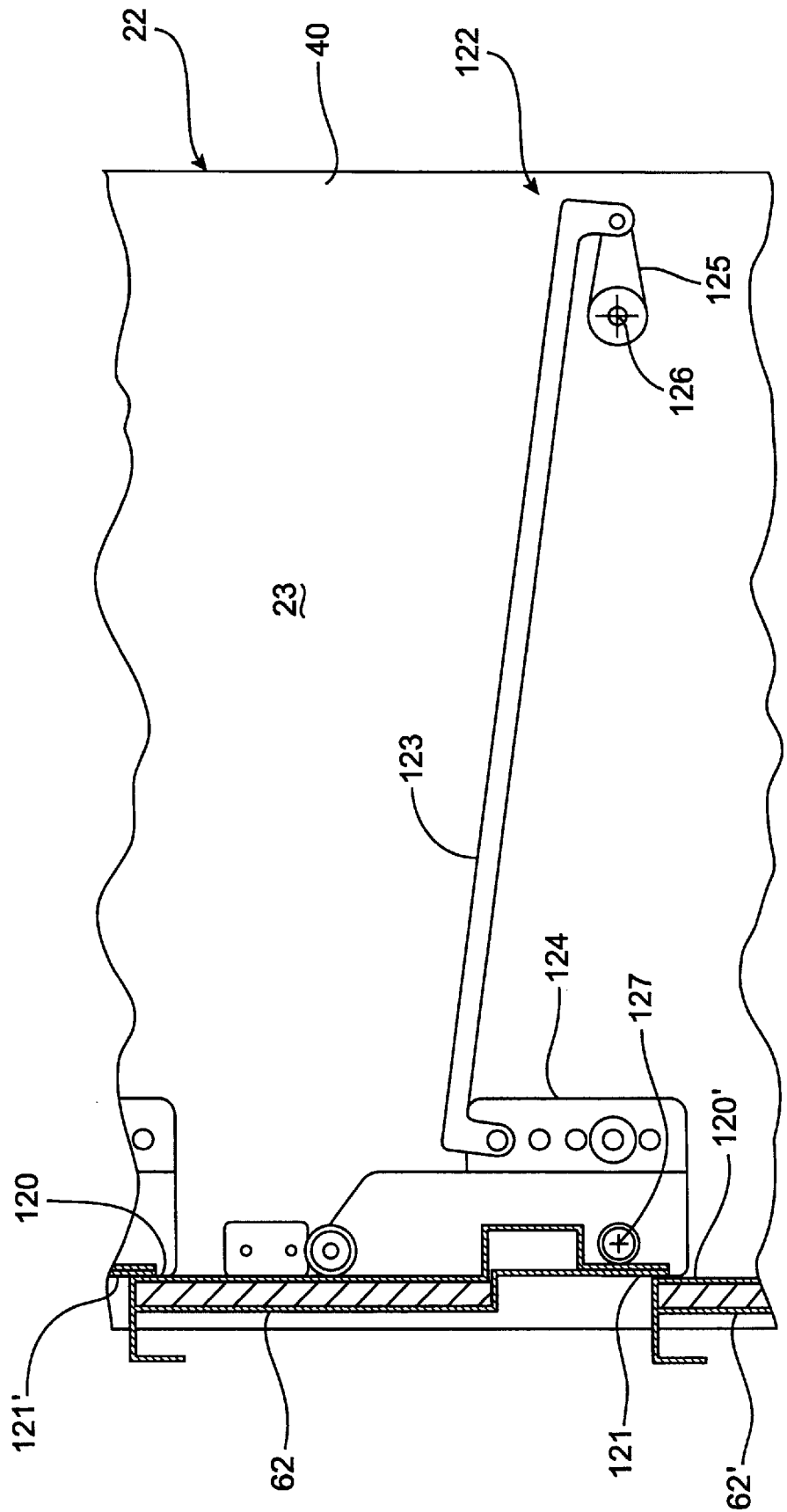

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Attention is now directed to FIGS. 1–5 where the present invention portable cleanroom cabinet assembly, generally designated 20, is illustrated formed to transport at least one electronic component 21 therein. The cabinet assembly 20 includes a portable cabinet device or housing 22, configured for mobile transport, which provides a cavity 23 (FIGS. 3 and 5) formed to support and receive the electronic components therein. The cabinet further defines at least one air flow passage, generally designated 32, having a first opening 33 in flow communication with an upstream end 29 of the cavity 23, and a second opening 35 in flow communication with an opposite downstream end 36 of the cavity 23. Collectively, the cavity and passage define a recirculating airflow pathway (represented by arrows 24, 25, 25', 26, 26', 27, 27', 28 and 28') such that substantially all the air flowing through the cavity 23 from the upstream end 29 to the downstream end 36 thereof recirculates back through the air flow passage to the upstream end. A blower assembly, generally designated 30, is communicably coupled to the recirculating airflow pathway to drive the recirculating air flow. A filter element 31 is positioned in the recirculating airflow path where the recirculating air flows through the filter element prior to entering the cavity 23. The flow of recirculating air through the cavity from the upstream end to the downstream end is substantially evenly distributed across a transverse cross-sectional dimension thereof.

Accordingly, the present invention provides a self-contained, mobile storage system which is capable of recirculating the air within the storage cabinet while still maintaining a substantially evenly distributed flow of air through the component cavity. This is highly advantageous since an even distribution of air flow transversely across the cross-sectional dimension substantially reduces flow turbulence. In turn, the disturbance of contamination particles already resting on the cassettes, components or shelving is less likely. Moreover, the present invention continuously recirculates the air flow in the cabinet assembly which provides substantial benefits absent in the prior art flow through designs. For one, the amount of contamination particles filtered out by the filter element is inherently less due to the recirculation arrangement. The usable life of the costly HEPA or ULPA filter, therefore, is generally longer. This is especially apparent for mobile storage units which frequently or periodically travel outside of the confines of a cleanroom or are utilized in cleanrooms of lower standards. Another significant benefit of the recirculating air flow design of the present invention is that the portable cleanroom cabinet assembly is substantially quieter to operate. In part, this is due to the fact that the noise generated by the blower assembly is directed back into the recirculating air flow pathway. In comparison, the noise generated by the blower assembly of the prior art flow through designs directly exits the bottom of the storage unit.

Briefly, it will be appreciated that the phrase describing the air flow through the cavity as being "substantially evenly distributed" is generally defined as air flow across a transverse cross-sectional dimension of the cavity which is constant, gentle, laminar and as streamlined as possible. While the air flow is not completely laminar in a technical context, the streamlined flow represents substantially parallel flow of an air mass, as a whole, through the cavity at a substantially constant velocity. The air flow would, thus, be so gentle so as not to create any significant turbulence when flowing past the wire rack shelf and stored components which may dislodge contaminating particles already resting thereon, typically less than about eighty (80) to one hundred (100) feet per minute.

The storage cavity, accordingly, is preferably provided by substantially straight walls which promote streamlined flow therethrough. Most preferably, as viewed in FIG. 5, the transverse cross-sectional dimension of cavity 23 is rectangular in shape. The cabinet is preferably composed of welded stainless steel construction with an extruded clear anodized aluminum outer structure. The stainless steel body panels and the outer structure serve to reinforce each other providing for a rigid assembly. A plurality of vertically-spaced, conventional stainless steel runners 37 are employed which extend horizontally from one side of cavity 23 to the other side thereof. These runners are fixed in their spacing, and are customized and sized to vertically support particular cassettes or particular electronic components. As will be better described below, the runners are supported by two stainless steel cross members 38, 38', each of which are retained on opposing sides of interior walls 40, 40' of cavity 23 at two points.

To provide mobile transport, conventional caster wheels 41 or the like are mounted to the bottom of the cabinet housing 22. It will be understood, however, that cabinet housing could be mated to a track or conveyor-type transport without departing from the present invention or used in a stationary fashion.

Referring back to FIG. 3, the recirculation pathway is schematically represented by arrows 24, 25, 25', 26, 26', 27, 27', 28 and 28'. Briefly, upon passing through storage cavity 23 from the upstream end 29 to the downstream end 36 in the streamlined, substantially evenly distributed manner across the transverse cross-sectional dimension of the cavity (the streamlined flow of which is represented by parallel arrows 24), the air flow is urged into the air flow passage 32 by blower assembly 30. While a single air flow passage is adequate in some instances, generally, a pair of air flow passages 32, 32' is preferable to facilitate production of an even distribution of air flow through the cavity. As best viewed in FIGS. 3 and 5, the two opposed air flow passages 32, 32' are preferably positioned on opposite sides of, and substantially parallel to, cavity 23 such that the air flow therethrough is in a direction opposite that flowing through cavity 23 (represented by arrows 27, 27' as compared to parallel arrows 24). It will be appreciated that each passage is sufficiently sized in the transverse cross sectional dimension to enable free flow therethrough without causing substantial flow resistance. Preferably, for a typical storage cavity 23 having a transverse cross-sectional dimension of about forty-two (42) inches by about twenty-eight (28) inches, each air flow passage 32, 32' will be provided with a transverse cross-sectional dimension of about four (4) inches by about twenty-eight (28) inches. These dimensions, of course, may vary, or be adjusted or scaled for a specific application.

In accordance with the present invention and as set forth above, the air flow through cavity 23 must be maintained substantially evenly distributed through the component cavity. Due to the opposite flow directions of the air flow through air flow passages 32, 32' (arrows 27, 27') and that of cavity 23 (arrow 24), it is difficult to supply the recirculated air across the entrance end 42 of the filter element 31 in a fashion promoting the necessary even flow distribution. At the opposed ends 43, 43' of the filter element 31, adjacent to the respective first openings 33, 33', as shown in FIG. 3, pockets or regions of stagnant air form at the corners thereof since the recirculating air discharged from the first openings exit at too great a velocity to negotiate the 180° turn and flow directly downward through the ends of the filter. The volume and velocity of the air flowing through a center portion of the cavity would be substantially greater than that at the opposed outer sides. Consequently, the streamlined air flow through the storage cavity would not materialize.

Accordingly, to promote an even parallel flow distribution transversely across the cross sectional dimension of the cavity, an accumulation chamber 45 is provided between the upstream end 29 of cavity 23 and the opposed first openings 33, 33' of the air flow passages 32, 32'. Therefore, as the recirculating air passes through the air flow passages, it is discharged from the first openings into the accumulation chamber where the velocity of the recirculating air is dispelled. This discharged air accumulates in the accumulation chamber 45 to provide a "reservoir" of recirculated air at the entrance end 42 of the filter element 31. The pressure of the accumulated air just before the filter entrance end 42 is caused to be more evenly distributed transversely thereacross.

In the preferred embodiment, to provide this buffer zone of accumulated air, the height of the accumulation chamber 45 above the entrance end 42 of the filter element 31 is preferably at least about three (3) inches to about five (5) inches. Most preferably, the height is maximized to promote even distribution but is limited in practice to minimize the overall height of the system. Moreover, the accumulation chamber 45 is preferably positioned in upstream linear alignment with the cavity 23 to facilitate linear flow through the filter element. In other instances, baffles may be used to facilitate flow distribution in restricted systems.

To further facilitate negotiation of the discharged recirculated air to the opposed ends 43, 43' of the filter element 31, outer portions 46, 46' of the upper interior wall 47 forming an upper portion of the accumulation chamber 45 are tapered inwardly at about a 30° to 60° angle, and most preferably at about a 45° angle. This configuration not only promotes deceleration of the discharged air, but also redirects portions of the air flowing in the direction of arrows 28, 28' back toward the opposed sides of the entrance end of the filter element and through the cavity (represented by parallel arrows 24). The outer portions 46, 46' of upper interior wall 47 may also be sufficiently curved to redirect the discharged air.

FIG. 3 best illustrates that the filter element 31 is positioned between accumulation chamber 45 and the upstream end 29 of cavity 23. Filter element 31, preferably provided by standard HEPA filters, ULPA filters, charcoal filters or chemical purifying filters, is configured to extends laterally across the transverse cross-sectional dimension of the recirculating air flow pathway from one end of the storage cavity 23 to the other end thereof. Accordingly, this filtered barrier creates a pressure drop across the filter element 31 from the upstream entrance end 42 to a downstream exit end 48. This pressure drop (about 0.25 inches of water), as well as the filter material, tend to further reduce turbulence as the recirculating air flow is forced through the filter element before entering cavity 23.

In accordance with the present invention, the recirculating airflow pathway further includes a collection chamber, generally designated 50, positioned between the downstream end 36 of the cavity 23 and the respective second openings 35, 35' of the pair of air flow passages 32, 32'. Similar to the accumulation chamber 45, the collection chamber 50 provides a buffer zone of air between the blower assembly 30 and the cavity 23 so that the even air flow distribution across the transverse cross-sectional dimension of the cavity may be maintained at the downstream end of the storage cavity. This collection chamber 50 provides a "reservoir" of air to be drawn into the blower assembly 30, as will be described in detail below, without compromising the streamlined nature of the parallel air flow through the cavity. Without this buffer zone of reserve air, the intake portions of the blower assembly would be positioned too close to the downstream end of the cavity. Thus, the surrounding air drawn into the blower assembly for recirculation would likely be directly supplied by the air from the downstream end of the cavity. Consequently, the streamlined, even flow distribution of the air proximate the intake of the blower assembly would be disrupted.

As shown in FIGS. 3 and 5, the portable cleanroom cabinet assembly includes a diffuser plate 51 which defines an upper portion of the collection chamber 50, and separates the storage cavity 23 from the blower assembly 30. This plate, which will be in described greater detail below, extends from one end of the cavity downstream end 36 to the other end thereof, and is positioned at a height above the blower assembly 30 by preferably about four (4) inches to about six (6) inches. Most preferably, the height above the blower assembly is about twenty-five percent (25%) of the shortest cross-sectional dimension to assure ample air space for local isolation between the cavity downstream end 36 and the intake portion of the blower assembly.

In the preferred form, blower assembly 30 is provided by a centrally mounted pressure blower 52 and a pair of recirculating blowers 53, 53' positioned on opposite sides of pressure blower 52. While a single recirculating blower may be adequate in some applications, two recirculating blowers are preferable to provide a more symmetric, efficient flow distribution through the opposed air flow passages 32, 32' and to the accumulation chamber 45 with the rectangular cross-section of this application.

FIGS. 3 and 4 best illustrate that both recirculating blowers 53, 53') include an intake port 55, 55' which fluidly communicates with the collection chamber 50. Each intake port 55, 55' provides a conical or inwardly tapered inlet collar 56, 56' to facilitate the intake of air into the respective recirculating blower. These inlet collars 56, 56' cooperate with intake apertures in a collector plate 57 to communicate with the collection chamber. The collector plate 57 separates the collection chamber 50 from a discharge chamber 58 where the blowers discharge drawn air for recirculation. Hence, after the collected "reserve" air is drawn in through the respective intake ports (represented by arrows 25), the air is discharged into discharge chamber 58 through discharge portions 59, 59' of the respective recirculating blowers where baffle members 60, 60' aerodynamically divert and direct the discharged air toward respective second openings 35, 35' of the respective air flow passages 32, 32'. These directional baffles members 60, 60' further cooperate with the clockwise rotating blowers to divide the discharged air from both the recirculating blowers 53, 53' toward the respective second openings 35, 35', as indicated by arrows 61 and 61' in FIG. 4. These baffle members further provide vertical support for the collector plate 57.

To ensure that the unfiltered ambient air does not flow into the recirculating air flow pathway in the event of system leakage or when the access doors 62 of cabinet housing 22 are opened, a positive pressure (about 0.10 to about 0.25 inches of water, and more preferably about 0.20 inches of water) is maintained within the cabinet assembly. As indicated-above, blower assembly 30 includes a centrally mounted pressure blower 52 having a conical or inwardly tapered inlet collar 63 of intake port 65 which fluidly communicates with the ambient air. Similar to recirculating blowers 53, 53', pressure blower 52 further includes a discharge portion 66 which discharges the drawn air into the discharge chamber 58. Accordingly, the ambient air discharged from discharge portion 66 is diverted by baffle members 60, 60' and is mixed with the air discharged from the recirculating blowers before passing into the respective second openings 35, 35' of the air flow passages 32, 32'.

In the preferred form, the inlet collar 63 of pressure blower 52 cooperates with an intake aperture at the bottom panel 67 of the cabinet device or housing 22 to communicate with the ambient air. The ambient air, thus, is drawn in from bottom of the cabinet assembly and into the recirculating pathway. To facilitate filtering of coarse contamination particles and prevent entrance into the initial recirculation airflow pathway, a pre-filter device 68 (FIGS. 3 and 6) is provided which extends transversely across the intake port 65 of the pressure blower 52. This filter may be provided by a conventional foam filter or fiber filter commonly employed to remove large, coarse particles in cleanroom environments.

To further foster streamlined, evenly distributed air flow at the downstream end 36 of the cavity 23, the above-mentioned diffuser plate 51 is sized and configured to control the quantity of air passing through the plate at predetermined regions thereof by locally controlling flow rate therethrough. Conceptually, at locations where the draw or suction of air flow through the diffuser plate 51 is larger and of greater velocity due to its proximity to the intake ports of the recirculation blowers, the distribution of air passage apertures 70 (FIG. 5) extending through the diffuser plate may be less dense to impede flow therethrough. In contrast, at locations where the draw or suction of air flow through the diffuser plate 51 is less and of smaller velocity (i.e. at regions more distant from the intake ports), the distribution of air passage apertures 70 may be more dense to promote more air flow therethrough. Essentially, the localized air passage aperture density is configured to compensate, relative the whole diffuser plate, for the abundance or lack thereof of potential air flow through the diffuser plate.

As best viewed in FIGS. 4 and 5, the recirculating blowers 53, 53' and the pressure blower 52 are preferably centrally and linearly aligned, relative the diffuser plate 51 and the transverse cross-sectional dimension of the cavity. Accordingly, due to the spaced-apart intake ports 55, 55' of recirculating blowers 53, 53', it is desirable to impede the air flow through the diffuser plate 51 directly above these components. In the preferred embodiment, a first apertured region 71 of the diffuser plate 51 is provided having an air passage aperture 70 distribution of lesser density which extends longitudinally along the plate and is positioned directly above the components. It will be appreciated that the region between the spaced-apart intake ports 55, 55', directly about pressure blower 52, also requires an aperture distribution of lesser density since the air drawn from the cavity in this region contributes to both recirculating blowers.

The aperture density of the first region 71 is preferably about one-half (½) the aperture density of the outer second regions 72 of the diffuser plate 51. The width of the first region 71 is preferably larger than the diameter of the intake ports of the recirculating blowers. The density proportions, width proportions and density patterns, however, may vary depending upon the resultant air flow through the diffuser plate 51 at the downstream end 36 of the cavity. For example, the air passage apertures could be radially patterned about the circular intake ports where the distribution density is gradually increased in proportion to the distance away from a center point directly above the intake ports. Alternatively, the air passage apertures could be elongated rectangles or pie-shaped where the apertures extend radically away from a center point. Moreover, in another embodiment, the diffuser plate may be capable of automatic or manual adjustment of the aperture density variations to compensate for varying flow rates and other desired changes. For instance, slidable plates may be employed to partially block air flow through the air passage apertures.

A pair of flow circular or conical distribution disks 73, 73', as shown in FIGS. 3 and 5, may also be provided which are vertically supported directly above the respective intake ports 55, 55' of the recirculating blowers. These distribution disks 73, 73' further impede the draw or intake of air directly above the respective intake ports. Accordingly, the intake air is radially drawn into the intake ports from the sides of the disk (arrows 25) to further promote an even flow distribution at the downstream end of the cavity. Support brackets 75 may be included extending across the collection cavity which vertically supports these disks a distance (D) of about midway from the inlet ports and the diffuser plate. Preferably, however, the cylindrical intake area defined between the perimeter of the disk 73, 73' and the intake port (i.e., $2\pi rD$, where r=disk radius and D=vertical distance from the disk perimeter to the intake port) is greater than or equivalent to the area of the intake port (generally $\pi r^2$), Therefore, D is equal to about r/2 or one-quarter (¼) of the diameter of the disk. Moreover, the diameter of the distribution disks (i.e., 2r) is preferably slightly smaller than the outer diameter of the inlet collar 56, but may be varied as necessary.

The recirculating blowers 53, 53' and the pressure blower 52 are preferably provided by conventional DC speed controlled blowers or fan motors operating at 24 volts. By increasing or decreasing the fan speed of the recirculating blowers, the flow velocity of the recirculating air can be controlled by increasing or decreasing the motor speed thereof. Similarly, by increasing or decreasing the motor speed of the pressure blower, the positive pressure differential between the cavity and the ambient air can be controlled and maintained. This arrangement is very effective to compensate for continuous system leakage or in the event of the opening of the access doors. Another example of when a pressure loss may be experienced in the storage cavity is when the filter element 31 becomes dirty over time. As buildup continues in the filter element during use, the load and pressure drop across the filter gradually increases. Hence, to maintain the same air flow through the cavity, the blower speed may be gradually increased.

Pressure sensors (not shown) may be positioned throughout the recirculation air flow path to sense and detect any pressure loss. These sensors could be operably coupled to automatic control systems (not shown) which in turn increase or decrease the pressure blower speed to respond to detected pressure drops. A predetermined fixed pressure profile, or even a graduated pressure profile, may then be automatically implemented and maintained. Similarly, the recirculating blowers may be operably coupled to the automatic control systems for automatic control of the recirculating flow velocity. It will be appreciated, however, that the speed of the recirculating blowers and/or the pressure blower could be manually operated as well without departing from the true spirit and nature of the present invention.

Alternatively, as viewed in FIG. 6, an adjustable flow device 76 may be provided which is configured to selectively control the intake flow of the ambient air through the intake portion 65 of the pressure blower 52. The flow device 76 adjusts the flow through area of the opening into the intake portion 65 which regulates the flow rate therethrough. Hence, the positive pressure of the recirculating air can be controlled in the recirculating airflow pathway without adjusting the blower speed. These two methods to control the positive pressure (i.e., the blower speed and the size of the opening to the intake port) in the cabinet assembly, however, may be combined.

Preferably, the adjustable flow device 76 includes a plurality of panels 77 which cooperate to open and close the opening into the intake port 65 in a manner similar to a camera shutter. This would enable simplified adjustment while retaining a circular opening area into the intake port. As another example, the adjustable flow device may be provided by a slotted plate which includes a plurality of adjustable sized slots. A 24 VDC power supply is included which powers the blowers while the blower assembly is connected to a 110 VAC power source. Two rechargeable batteries, such as the Johnson Controls Dynasty GC12V65B batteries, are provided in conjunction with the VAC power source to power the unit when the mobile cabinet assembly cannot be powered by an AC power source. A small power inverter is further included to power some of the smaller components, such as an ionizer device (not shown), to be described below. This arrangement is more efficient than providing a system employing AC motors with a large power inverter, and ultimately provides substantially longer run times on the batteries.

In accordance with the present invention, the control systems, the batteries and the inverters are preferably positioned below the collection chamber 50. These units are modular in configuration to enable simplified repair and replacement; a significant advantage in a cleanroom environment. By further positioning the blower assembly 30 below the storage cavity, the collective center of gravity can be substantially lowered. The mobile storage system of the present invention, thus, is more maneuverable and is less susceptible to tipping instability. Moreover, repositioning the blower assembly from the top of the unit (as in the prior art designs) to the bottom of the unit, the overall height is decreased. This results in a mobile storage system which is more space efficient.

A conventional ionization device (not shown), such as 5285-28 ionization bar by Ion Systems, Inc., may be provided at the upstream end of the storage cavity. This ionization device emits ions into the air stream flowing through the storage cavity to dissipate any stagnant charges on the product. Further, conventional humidity and temperature controls may be included to provide an internal environment suitable to store particular electronic components.

Turning now to FIG. 7, an alternative embodiment of the present invention is illustrated having a single blower 78 which doubles as a pressure blower and a recirculation blower. The single blower 78 is preferably provided by an open-ended squirrel-cage type blower which is configured to draw recirculating air from an upper recirculation intake port 55 for recirculation thereof, as well as draw air from a lower pressure intake port 65 to adjust the positive pressure in the storage cavity 23.

To regulate the positive pressure in the storage cavity, an adjustable flow device 76 similar to that of FIG. 6 may also be provided which blocks or impedes air flow through to the recirculation intake port 65. Accordingly, the opening diameter of the adjustable flow device would be increased to increase the pressure differential in the cavity, while the opening diameter thereof would be decreased to decrease the pressure differential. Alternatively, the adjustable flow device 76 may also be provided by a slotted plate having a plurality of adjustable sized slots. Similarly, the upper recirculation intake port may include an adjustable flow device to control the recirculating flow or the blower speed may be adjusted.

An analogous collection chamber 50 may include interior walls 81 which direct and funnel the flow of air into the recirculation intake port 55. Similar to the preferred multi-blower embodiment of the present invention, and without detailing a discussion of the same, the single blower embodiment of FIG. 7 preferably includes analogous components to promote the substantially evenly distributed air flow through the storage cavity 23. These structural components include, amongst others described above: a diffusion plate; an accumulation chamber; and a flow distribution disk, etc.

As an alternative to, or as an addition to, the diffuser plate, the single blower embodiment, as well as the preferred multi-blower embodiment, may include a charcoal-type filter 82 which extends across the transverse cross-sectional dimension of the cavity, and separates it from the collection chamber 50. This filter 82 would not only filter out any fumes or chemicals evaporating from the electronic components, but would also function as a diffuser plate to provide a sufficient pressure drop across the filter to promote a substantially evenly distributed air flow through the storage cavity.

A single blower may also be employed which does not include an intake port. In this arrangement, to create a positive pressure in the accumulation chamber, apertures may be provided in the walls defining the collection chamber. This assures a pressure drop across the diffuser plate rather than drawing ambient air in through the storage cavity. A positive pressure will then be generated for the accumulation chamber, and thus the storage cavity.

Moreover, the recirculation blowers 53, 53' and the pressure blower 52 may be located atop the filter element 31(not shown) which are in direct communication with accumulation chamber 45. In this embodiment, the collection chamber 50 and the discharge chamber 58 would be positioned above the accumulation chamber. In other embodiments, either the pressure blower or the recirculation blower may be located atop the filter element, while the recirculation blower or the pressure blower, respectively, may be positioned below the cavity.

Turning now to FIGS. 3, 8 and 9, shelf mounting bracket devices 83, 83', 85 and 85' are illustrated which releasably mount the conventional runner shelves 37 to the cabinet assembly 20. At least the two front bracket devices 83, 85 are selectively movable between a first stable condition (FIGS. 8 and 9A) and a second stable condition (FIG. 9C). In the first stable condition, these bracket device 83, 85 supportably lock the shelf 37 in the cavity of housing 22. In the second stable condition, these bracket devices 83, 85 enable removal of the shelf 37 through an access opening 86 into the cavity 23 when the access doors 62 are in the opened position. The shelf 37 and bracket devices 83, 85 further cooperate to form bi-stable, over-center, linkage assemblies 87, 89 therebetween movable between and biased toward both of. (i) the first stable condition on one side of a linkage assembly centerline 88 (FIG. 9A); and (ii) the second stable condition on an opposite side of the linkage assembly centerline 88 (FIG. 9C). Accordingly, when the shelf is positioned directly at the linkage assembly centerline 88 (FIG. 9B), the linkage assembly will neither be biased toward the first stable condition nor the second stable condition. However, should the shelf 37 be repositioned in the direction of arrow 90 (FIG. 9A), linkage assembly 87, 89 and the corresponding bracket device 83, 85 will be urged toward and into the first stable condition. By comparison, should the shelf 37 be repositioned in the opposite direction (arrow 91 in FIG. 9C), the linkage assembly 87, 89 and bracket device 83, 85 will be urged toward and into the second stable condition.

This arrangement enables a single person to unlock the brackets and move them to the second stable condition. Subsequently, the shelf may be removed by the one person to clean the cavity or the like.

Briefly, as mentioned above, conventional stainless steel runner shelves 37 are employed which extend horizontally from one side of cavity 23 to the other side thereof. These runners are fixed in their spacing, and are customized and sized to vertically support particular cassettes or particular electronic components. The runner shelves are supported by two stainless steel cross members 38, 38', each of which is supported on opposing sides of interior walls 40, 40' of cavity 23 by the respective bracket devices 83, 85 and 83', 85'. These bracket devices 83, 85 and 83', 85' each include a support socket 92, 93 and 92', 93' formed and dimensioned for snug, receipt of a respective cylindrical-shaped shelf post (95, 96 and 95', 96') located on the opposed distal ends of the cross members 38, 38'. Hence, the shelf posts are vertically supported on the interior wall 40, 40' of the housing 22 when received in the respective socket of bracket device in the first stable condition.

For clarity purposes, only one linkage assembly 87 (i.e., bracket device 83 and the corresponding shelf post 95) will be described in detail. It will be appreciated, however, that at least one pair of opposed linkage assemblies is operatively mounted to the interior walls 40, 40' for movement between the first stable condition and the second stable condition.

FIGS. 9A and 9C best illustrate that bracket device 83 is pivotally mounted to interior wall 40 about pivotal axis 98 between the first stable condition (FIG. 9A) and the second stable condition (FIG. 9C). In the first stable condition, an upper portion of bracket device 83 may be affixed to the interior wall 40 through a lock screw 97 or the like. Accordingly, shelf 37 will be prevented from removal from cavity 23 in the direction of arrow 91 due to the inability of bracket device 83 to rotate about pivot axis 98 when the shelf post 95 contacts with a back wall portion 100 of bracket device 83. Collectively, these two components form linkage assembly 87 which are movable between and biased toward one of the first stable condition and the second stable condition.

Socket 92 is preferably substantially U-shaped and is dimensioned for sliding receipt of shelf post 95 therein. As shown in FIG. 9A, in the first stable condition of the linkage assembly, the shelf post 95 is positioned just past the left side of pivot axis 98 where the shelf post contacts an outer shoulder portion 101 of socket 92 forming a counter clockwise shelf post moment arm due to the weight of the shelf 37. Moreover, this positions the center of gravity of the bracket device just over the linkage assembly centerline 88 as well, forming a counter clockwise bracket moment arm. This arrangement collectively causes a counter-clockwise moment arm about pivot axis 98, urging a counter-clockwise rotation of bracket device 83 and matably urging shelf post 95 into socket 92 (i.e., the first stable condition of linkage assembly 87). Accordingly, even when the lock screw 97 is removed, the counter clockwise moment about pivot axis 98 still retains the linkage assembly in the first stable condition.

However, upon removal of the shelf 37 in the direction of arrow 91 (FIG. 9C), once the shelf 37 and the shelf post 95 are positioned just past the linkage assembly centerline 88 (FIG. 9B) and when the shelf post 95 is on the right side of pivot axis 98, a clockwise moment arm is formed about the pivot axis 98. This clockwise shelf post moment together with the clockwise bracket moment formed by the center of gravity of the bracket device 83 being positioned to the right side of the pivot axis, causes a clockwise rotation of bracket device 83 toward the second stable condition (FIG. 9C). As the bracket device is rotated in a clockwise manner, the linkage assembly is urged toward the second stable condition where the shelf post 95 slides out of socket 92 and atop a distal end 102 of bracket device 83 for stable vertical support thereon. Subsequently the shelf can then be removed through access opening 86. The shelf posts, thus, are preferably composed of some reduced friction material such as Ultra High Molecular Weight Polyethylene (UHMWPE) or the like.

Movable access doors 62, 62' are provided which enable access to cavity 23 through access opening 86. These doors are preferably composed of clear static dissipative polycarbonate with stainless steel frames, and preferably run the full width of the cavity when the horizontal fold-down doors are employed. In accordance with the present invention, either the multiple horizontal fold-down doors 62, 62' of the embodiment of FIGS. 1–7, or the vertical fold-open doors 62, 62' of the embodiment of FIGS. 10–13, may be employed with the cabinet assembly 20. For example, the two vertical fold-open doors may be employed when the electronic components are relatively large, or when it is more desirable to access a larger portion of the cavity 23 at once. However, the larger opening to the cavity through the access doors may result in a greater pressure loss.

When vertical doors 62, 62' are employed, it is often desirable to provide a simple means for removal of the doors from the cabinet housing 22 for cleaning purposes or for increased access to cavity 23 through access opening 86. To prevent inadvertent removal from the cabinet housing 22, special vertical hinge devices 103, 103' are provided which only enable removal of the door 62 from the housing 22 when the hinge devices 103, 103' are rotated about hinge axis 105 from a retained position (FIGS. 11A, 11B, 12A and 13A), preventing separation therebetween, to a release position (FIGS. 11C, 11D, 12B, 12C and 13C). Once oriented in this released position, the hinge devices 103, 103' are configured to provide the necessary clearance to permit separation between the components of the hinge device and thus removal of the door 62 (FIGS. 11D and 12C). While only one lockable hinge device is necessary to prevent or permit selective removal of the door, preferably upper and lower hinge devices 103, 103' are provided for redundancy.

Each hinge device 103, 103' includes three (3) components which cooperate to move the door 62 between a closed position (FIGS. 10, 11A, 12A and 13A) and an opened position (FIGS. 11B, 11C, 12B, 13B and 13C) which correspond to the hinge devices being oriented in one of the retained position and the release position, respectively. A first component of the hinge device 103, 103' is an anchor member 106, 106' formed for mounting to a frame or wall 40 of cabinet housing 22. Hinge device 103, 103' further includes an upper hinge member 107, 107' positioned above anchor member 106, 106' and a lower hinge member 108, 108' positioned below anchor 106, 106', each being in vertical axial alignment when arranged in the retained position (FIGS. 11A and 12A).

To provide pivotal movement therebetween, anchor member 106, 106' includes a pivot pin 110, 110' protruding upwardly from a support shoulder 111, 111' thereof. Pivot pin 110, 110' preferably positioned proximate an outer edge of support shoulder 111, 111', and is slidably and pivotally received in a receiving bore 112, 112' provided in an opposed support shoulder 109, 109' of upper hinge member 107, 107'. Preferably, at least two pivot pins and corresponding receiving bores are provided to enable door 62 to pivot between the opened and closed positions. It will further be understood that the pivot pin may extend downwardly from support shoulder 109, 109' of upper hinge member 107, 107' for slidable and rotatable receipt in a pin bore provided in the support shoulder 111, 111' of anchor member 106, 106' without departing from the true spirit and nature of the present invention.

Referring to FIGS. 11A, 11B and 12A, when hinge device 103 is oriented in the retained position (i.e., preferably about 0° to about 175° of clockwise rotation about the hinge axis 105 when the respective door 62 is closed to when the door is opened) upward slidable vertical separation of the pivot pin 110, 110' from the receiving bore 12, 112' is prevented due to interfering contact between a contact shoulder 113, 113' of lower hinge member 108, 108' and an opposite contact shoulder 115, 115' of anchor member 106, 106'. Accordingly, during pivotal opening of door 62, such as when the door is opened about 90° (FIGS. 11B and 13B), removal thereof from housing 22 cannot occur until the vertical interfering contact between the opposed contact shoulders 113, 115 and 113', 115' is eliminated. Some vertical movement between the hinge members and the anchor members, however, is permitted by an amount equivalent to the gap provided between the opposed contact shoulders. The length of the gap, however, is less than the height of the pivot pin 110.

To eliminate the interfering contact between the opposed contact shoulders 113, 115 and 113', 115' of the lower hinge members 108, 108') and the anchor members 106, 106', respectively, opposed clearance portions 116, 117 and 116', 117' are provided. When the door 62 is fully opened in the opened position and the hinge device is aligned in the release position (i.e., preferably about 180° as shown in FIGS. 11C, 12B and 13C), the clearance portions 116, 117 and 116', 117' are sufficiently aligned and configured to eliminate vertical interfering contact between the opposed contact shoulders. Accordingly, the upper and lower hinge members 107, 108 and 107', 108' can be separated from the corresponding anchor members 106, 106' as the pivot pins 110, 110' are released from receiving bores 112, 112'(FIGS. 11D and 12C).

Preferably the hinge members and corresponding anchor members are rectangular in shape such that the contact shoulders and the support shoulders are substantially planar and square. The clearance portions 116, 117 and 116', 117' are provided by chamfers formed along cooperating edges in the respective contact shoulders 113, 115 and 113', 115'. These chamfers are sufficiently sized to enable sufficient vertical movement in the direction of arrow 118, in FIGS. 11D and 12C, so that pivot pin 110 can be cleared from receiving bore 112. In an alternative embodiment, only one chamfer may be necessary if sufficiently large to eliminate interfering contact.

Turning now to FIGS. 14A–14C, the horizontal folding doors 62, 62' are illustrated in nested or overlapping relationship relative one another. This nested relationship facilitates space efficiency and reduces leakage from cavity 23 since an upper edge 120' of door 62' seatably seals against a bottom lip portion 121 of door 62. The bottom lip portion 121, which extends the full width of the door, is inset by an amount essentially equivalent to about the thickness of the door 62 so that the adjacent doors are vertically aligned when in a closed position (FIG. 14A).

To facilitate automation, an over-center swing arm linkage assembly 122 is coupled to horizontal fold-down door 62 for movement of the door about hinge axis 127 between a closed position (FIG. 14A) and an opened position (FIG. 14C). As shown in FIGS. 14A–14C, linkage assembly 122 includes an elongated actuating arm 123 having one end movably mounted to a bracket device 124 of door 62 and an opposite end movably mounted to a swing arm 125 which cooperate to automatically open and close the door.

Swing arm 125 is coupled to a motor device (not shown) which selectively reciprocates swing arm 125 about 180° about a swing arm axis 126 (i.e., between FIGS. 14A, 14B and 14C). The motor device is preferably provided by a single speed rotary air cylinder, electrical rotary device or a DC gear motor with limit switches or the like. Due to the linkage arrangement between the swing arm and the actuating arm, the linkage assembly 122 causes the opening and closing of door 62 to naturally accelerate and decelerated at the extremes of motion of the swing arm (i.e., at about 0° and at about 180°).

For example, as the swing arm 125 is rotatably moved toward or away from either 0° rotation thereof (FIG. 14A) or 180° of rotation about swing arm axis 126 (FIG. 14C), the door 62 is either naturally accelerating from or deceleration toward the closed position or the opened position, respectively. Moreover, when the swing arm is at a 90° angel relative the actuationg arm (FIG. 14C), the speed of the opening or closing of the door is at a maximum. Accordingly, in this configuration, the door can be accelerated or decelerated toward or away from one of the closed position or the opened position using a single speed motor, and without the need for speed reduction components.

Moreover, when the linkage assembly 122 is positioned in the extreme opened position (FIG. 14C) or closed position (FIG. 14A), the door 62 cannot be manually opened or closed since the longitudinal axis of the swing arm 125 and of the actuating arm 123 are substantially parallel to one another. Manual rotation of the door 62 about hinge axis 127 is therefore not possible since the axial force urged upon the swing arm 125 by the actuating arm 123 are oriented in the same direction which is through the swing arm axis 126 at each of these positions. A bending moment, thus, cannot be created by the swing arm 125 about the swing arm axis 126. Accordingly, in either of the extreme opened or closed position, the linkage assembly 122 is inherently locked in position.

Figure 15A:
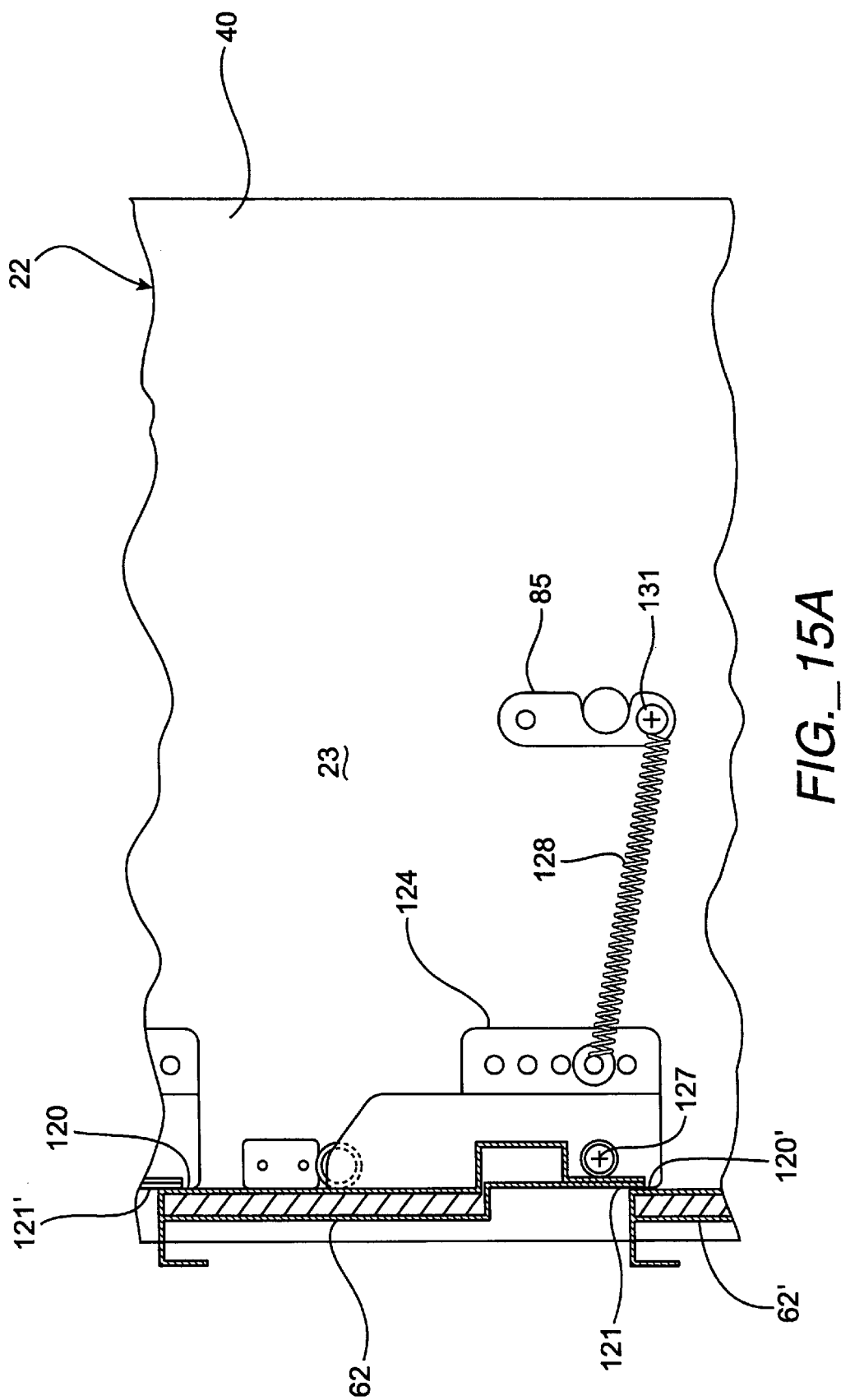

In an alternative embodiment, horizontal fold-down doors 62, 62' may be configured for manual operation. FIGS. 15A and 15B best illustrate a biasing device 128 coupled between door 62 and cabinet housing 22 which biases door 62 in the closed position (FIG. 15A). In the preferred embodiment, biasing device 128 is provided by a tension or coil spring having one end coupled to a bracket portion 124 of door 62 and an opposite end anchored to the pivot bolt 131 of shelf mounting bracket device 85. The tension of spring 128 is preferably chosen such that once the door 62 is rotated about hinge axis 127 at about a 45° angle, the weight of the door 62 is sufficient to move the door to the opened position (FIG. 15B). However, once moved back to a position less than about the 45° angle, spring 128 urges the door toward the closed position.

What is claimed:

1. A portable cleanroom cabinet assembly for the transport of at least one electronic component comprising:
   a portable cabinet device configured for mobile transport, and defining a cavity formed for receipt of the at least one electronic component therein, said cabinet further defining at least one air flow passage having a first opening in flow communication with an upstream end of said cavity, and a second openingin flow communication with an opposite downstream end of said cavity to define a recirculating airflow pathway such that substantially all the air flowing through said cavity and past said one electronic component from said upstream end to said downstream end thereof recirculates back through said air flow passage to said upstream end;
   a filter element positioned in said recirculating airflow pathway to filter the recirculating air prior to entering said cavity; and
   a blower assembly having a pressure blower portion in selective communication between the ambient air outside of the recirculating airflow pathway and the recirculating air to generate a positive pressure relative the ambient air, and a recirculating blower portion to drive the recirculating air flow.

2. A portable cleanroom cabinet assembly as defined in claim 1 wherein,
   said air flow passage is provided by a pair of air flow passages positioned on opposite sides of said cavity.

3. A portable cleanroom cabinet assembly as defined in claim 2 wherein,
   said recirculating pathway includes an accumulation chamber positioned between the upstream end of the cavity and the respective first openings of the pair of air flow passages to accumulate a reservoir of the recirculating air therein prior to passing into the cavity.

4. A portable cleanroom cabinet assembly as defined in claim 1 wherein,
   said recirculation pathway includes an accumulation chamber position between the upstream end of the cavity and the first opening to accumulate a resevoir of the recirculating air therein prior to passing into cavity.

5. A portable cleanroom cabinet assembly as defined in claim 4 wherein,
   said accumulation chamber is positioned adjacent to and generally linearly said accumulation chamber is configured to substantially evenly distribute the upstream from said upstream end of the cavity.

6. A portable cleanroom cabinet assembly as defined in claim 5 wherein,
   said accumulation chamber is configured to substantially evenly distribute the pressure of the accumulated air therein, laterally across the transverse cross-sectional dimension of the cavity upstream end and prior to entering the cavity, to provide an even flow distribution of the recirculating air therethrough.

7. A portable cleanroom cabinet assembly as defined in claim 3 wherein,
   the first openings of the respective air flow passages discharge the recirculating air into said accumulation chamber at the opposite ends thereof.

8. A portable cleanroom cabinet assembly as defined in claim 6 wherein,
   said accumulation chamber is partially defined by tapered interior walls positioned proximate the respective first openings and formed to dispel the velocity of the recirculating air discharged into the accumulation chamber from the air flow passages.

9. A portable cleanroom cabinet assembly as defined in claim 4 wherein,
   said filter element is positioned laterally across the transverse cross-sectional dimension of the recirculating airflow pathway between the accumulation chamber and the upstream end of said cavity.

10. A portable cleanroom cabinet assembly as defined in claim 1 wherein,
    said filter element is positioned laterally across the transverse cross-sectional dimension of the recirculating airflow pathway between the first opening of the air flow passage and the upstream end of said cavity.

11. A portable cleanroom cabinet assembly as defined in claim 10 further including:
    a second filter element positioned laterally across the transverse cross-sectional dimension of the recirculating air flow pathway between the downstream end of said cavity and the second opening of the air flow passage.

12. A portable cleanroom cabinet assembly as defined in claim 10 wherein,
    said recirculating pathway includes an accumulation chamber positioned between the first opening of the air flow passage and an entrance side of the filter element to accumulate a resevoir of the recirculating air therein, discharged from the first opening prior to entering the cavity.

13. A portable cleanroom cabinet assembly as defined in claim 12 wherein,
    said accumulation chamber is positioned adjacent to and generally linearly upstream from said upstream end of the cavity.

14. A portable cleanroom cabinet assembly as defined in claim 13 wherein,
    said accumulation chamber is configured to substantially evenly distribute the pressure of the accumulated air therein, laterally across the transverse cross-sectional dimension of the upstream end and prior to entering said cavity, to provide an even flow distribution therethrough.

15. A portable cleanroom cabinet assembly as defined in claim 1 wherein, said pressure blower portion includes an ambient air intake portion in flow communication with the ambient air outside of the recirculating airflow pathway, a recirculating air intake portion in flow communication with the recirculating air inside the recirculating airflow pathway, and a discharge portion formed to discharge the air drawn through the intake portions into the recirculating airflow pathway to drive the recirculating air flow.

16. A portable cleanroom cabinet assembly as defined in claim 15 further including:

a distribution device positioned adjacent and proximate to the blower assembly intake portion, and configured to cause the air to be radially drawn into the intake portion from the sides of the distribution device.

17. A portable cleanroom cabinet assembly as defined in claim 1 wherein, said blower assembly is positioned between said downstream end of the cavity and the second opening of the air flow passage.

18. A portable cleanroom cabinet assembly as defined in claim 15 wherein, the said blower assembly is configured to selectively control the intake of the ambient air through said ambient air intake portion to generate said positive pressure relative the ambient air.

19. A portable cleanroom cabinet assembly as defined in claim 18 wherein, said ambient air intake portion includes an adjustable flow device coupled to said pressure blower and configured to selectively control the intake flow of the ambient air through the ambient air intake portion to variably control the positive pressure of the recirculating air in the recirculating airflow pathway.

20. A portable cleanroom cabinet assembly as defined in claim 18 wherein, the blower assembly is provided by a variable speed fan device.

21. A portable cleanroom cabinet assembly as defined in claim 1 wherein, said blower assembly is positioned between said downstream end of the cavity and the second opening of the air flow passage, and said pressure blower portion includes a discharge portion in direct flow communication with a discharge portion of the recirculating blower portion, and said recirculating blower portion includes a recirculating air intake portion in direct flow communication with a collection chamber.

22. A portable cleanroom cabinet assembly as defined in claim 1 further including:

an adjustable flow device coupled to the pressure blower portion, and configured to selectively control the intake flow of the ambient air through an ambient air intake portion of the pressure blower portion to variably control the positive pressure of the recirculating air in the recirculating airflow pathway.

23. A portable cleanroom cabinet assembly as defined in claim 1 wherein, the pressure blower portion is provided by a variable speed fan device adapted to selectively control the positive pressure of the recirculating air in the recirculating airflow pathway, and the recirculating blower portion is provided by a variable speed fan device adapted to selectively control the velocity flow of the recirculating air in the recirculating airflow pathway.

24. A portable cleanroom cabinet assembly as defined in claim 23 further including:

a control device electronically coupled to the pressure blower and the recirculating blower to automatically control the relative flow rate outputs thereof.

25. A portable cleanroom cabinet assembly as defined in claim 1 wherein, said pressure blower portion is provided by an independent pressure blower centrally positioned in said cavity, and said recirculating blower portion is provided by two independent recirculating blowers positioned on opposite sides of the independent pressure blower.

26. A portable cleanroom cabinet assembly as defined in claim 25 wherein, said air flow passage is provided by a pair of air flow passages positioned on opposite sides of said cavity.

27. A portable cleanroom cabinet assembly as defined in claim 21 further including:

a pre-filter device coupled to the pressure blower to filter the ambient air before exiting the discharge portion thereof into the recirculating airflow pathway.

28. A portable cleanroom cabinet assembly as defined in claim 23 wherein, said recirculating airflow pathway includes a collection chamber positioned between the downstream end of the cavity and the second opening of the air flow passage to accumulate a reservoir of diffused air therein after the recirculating air exits the cavity downstream end and before being drawn into the recirculating air intake portion of the recirculating blower portion.

29. A portable cleanroom cabinet assembly as defined in claim 28 wherein, said discharge portion of the pressure blower portion and the discharge portion of the recirculating blower portion are communicably coupled directly to the second opening collection chamber.

30. A portable cleanroom cabinet assembly as defined in claim 28 further including:

a diffuser plate extending across a transverse cross-sectional dimension of said downstream end, separating said cavity from said collection chamber.

31. A portable cleanroom cabinet assembly as defined in claim 30 wherein, said diffuser plate is sized and configured to locally control the velocity of recirculating air passing through the downstream end into the collection chamber.

32. A portable cleanroom cabinet assembly as defined in claim 31 wherein, said diffuser plate defines a plurality of air passage apertures extending therethrough, the concentration thereof being less dense proximate the recirculating air intake portion of the recirculating blower portion.

33. A portable cleanroom cabinet assembly as defined in claim 23 further including:

a baffle plate spaced-apart from and positioned adjacent a discharge portion of the recirculating blower portion and a discharge portion of the pressure blower portion.

34. A portable cleanroom cabinet assembly as defined in claim 17 wherein, said recirculating airflow pathway includes a collection chamber between the downstream end of the cavity and the second opening of the air flow passage to accumulate a reservoir of diffused air therein before being drawn into an intake portion of the blower assembly.

35. A portable cleanroom cabinet assembly as defined in claim 34 wherein,
said collection chamber is positioned adjacent to and generally linearly downstream from said downstream end of the cavity.

36. A portable cleanroom cabinet assembly as defined in claim 3 wherein,
said accumulation chamber is configured to substantially evenly distribute the pressure of the accumulated air therein, laterally across the transverse cross-sectional dimension of the cavity upstream end and prior to entering the cavity, to provide an even flow distribution of the recirculating air therethrough, and
said recirculating airflow pathway includes a collection chamber between the downstream end of the cavity and the second opening of the air flow passage to accumulate a reservoir of diffused air therein before being drawn into an intake portion of the blower assembly.

37. A portable cleanroom cabinet assembly as defined in claim 36 wherein,
said accumulation chamber is positioned adjacent to and generally linearly upstream from said upstream end of the cavity, and
said collection chamber is positioned adjacent to and generally linearly downstream from said downstream end of the cavity.

38. A portable cleanroom cabinet assembly as defined in claim 1 further including:
a shelf positioned in said cavity and configured to extend from one side of said cavity to the other side thereof; and
a bracket device cooperating with said shelf for selective movement of said bracket device between a first stable condition, supportably locking said shelf to the interior walls defining said cavity, and a second stable condition, enabling removal of said shelf from an access opening into said cavity.

39. A portable cleanroom cabinet assembly as defined in claim 38 wherein,
said shelf and said bracket device cooperate to provide a bi-stable, over-center, linkage assembly movable between and biased toward both of:
(i) a first stable condition on one side of a linkage assembly centerline when said bracket device is in said first stable condition; and
(ii) a second stable condition on an opposite side of said centerline when said side bracket device is in said second stable condition.

40. A portable cleanroom cabinet assembly as defined in claim 1 wherein,
said portable cabinet device includes a door member pivotally movable between an open position, enabling access to the cavity through an access opening, and a closed position, preventing access to said cavity through said access opening, and
a hinge device mounting said door member to said cabinet device for pivotal
a hinge device mounting said door member to said cabinet device for pivotal movement of the door member between the opened and closed condition, and movable between a retained position, preventing separation of said door member from said cabinet device, and a released position, corresponding to a specific location in said open position to enable selective separation of the door member from the cabinet device.

41. A portable cleanroom cabinet assembly as defined in claim 40 wherein,
said hinge device includes an anchor member, having a contact shoulder, mounted to the cabinet device and a hinge member, having an opposed contact shoulder, mounted to the door member, said hinge member pivotally coupled to said anchor member for said pivotal movement of the door between the closed position and the opened position such that the contact shoulders are configured to be in interfering contact with one another to prevent separation therebetween when position in the retained position, and said contact shoulders are configured to move out of interfering contact at the specific location and when said hinge device is in the release position.

42. A portable cleanroom cabinet assembly for the transport of at least one component comprising:
a portable cabinet device configured for mobile transport, and defining a cavity formed for receipt of the at least one component therein, said cabinet further defining at least one air flow passage having a first opening in flow communication with an upstream end of said cavity, and a second opening in flow communication with an opposite downstream end of said cavity to define a recirculating airflow pathway such that substantially all said air flowing through said cavity from said upstream end to said downstream end thereof recirculates back through said air flow passage to said upstream end;
a blower assembly communicably coupled to said recirculating airflow pathway to drive the recirculating air flow; and
a filter element positioned in the recirculating airflow pathway such that the recirculating air flows through said filter element prior to entering said cavity;
a diffuser plate extending across a transverse cross sectional dimension of said downstream end, and sized and configured to locally control the velocity of recirculating air passing through the downstream end into said second opening such that the flow of recirculating air through said cavity from the upstream end to the downstream end is substantially evenly distributed across a transverse cross-sectional dimension thereof.

43. A portable cleanroom cabinet assembly as defined in claim 42 wherein,
said air flow passage is provided by a pair of air flow passages positioned on opposite sides of said cavity.

44. A portable cleanroom cabinet assembly as defined in claim 43 wherein,
said recirculating pathway includes an accumulation chamber positioned between the upstream end of the cavity and the respective first openings of the pair of air flow passages to accumulate a reservoir of the recirculating air therein prior to passing into the cavity.

45. A portable cleanroom cabinet assembly as defined in claim 44 wherein,
said accumulation chamber is positioned adjacent to and generally linearly upstream from said upstream end of the cavity.

46. A portable cleanroom cabinet assembly as defined in claim 45 wherein,
said accumulation chamber is configured to substantially evenly distribute the pressure of the accumulated air therein, laterally across the transverse cross-sectional dimension of the cavity upstream end and prior to entering the cavity, to provide an even flow distribution of the recirculating air therethrough.

47. A portable cleanroom cabinet assembly as defined in claim 46 wherein,
the first openings of the respective air flow passages discharge the recirculating air into said accumulation chamber at opposite ends thereof.

48. A portable cleanroom cabinet assembly as defined in claim 42 wherein,
said filter element is positioned laterally across the transverse cross-sectional dimension of the recirculating airflow pathway adjacent the diffuser plate and between the downstream end of said cavity and the second opening of the air flow passage.

49. A portable cleanroom cabinet assembly as defined in claim 42 wherein,
said recirculating airflow pathway includes a collection chamber positioned between the diffuser plate and the second opening of the air flow passage to accumulate a resevoir of diffused air therein after the recirculating air exits the cavity downstream end and before being drawn into an intake portion of the blower assembly.

50. A portable cleanroom cabinet assembly as defined in claim 49 wherein,
said collection chamber is positioned adjacent to and generally linearly downstream from said downstream end of the cavity.

51. A portable cleanroom cabinet assembly as defined in claim 49 wherein,
said blower assembly is positioned between said collection chamber and the second opening of the air flow passages.

52. A portable cleanroom cabinet assembly as defined in claim 51 wherein,
said intake portion of said blower assembly in communication with both the ambient air outside of the recirculating airflow pathway and the recirculating air inside the recirculating airflow pathway, and a discharge portion formed to discharge the air drawn through the intake portion into the recirculating airflow pathway.

53. A portable cleanroom cabinet assembly as defined in claim 52 wherein,
said blower assembly includes
a pressure blower in selective communication between the ambient air outside of the recirculating airflow pathway and the recirculating air to generate a positive pressure relative the ambient air, and
a recirculating blower to drive the recirculating air flow.

54. A portable cleanroom cabinet assembly as defined in claim 53 wherein,
and said pressure blower includes a discharge portion in direct flow communication with a discharge portion of the recirculating blower, and said recirculating blower includes an intake portion in direct flow communication with the collection chamber.

55. A portable cleanroom cabinet assembly as defined in claim 54 wherein,
the pressure blower is provided by a variable speed fan device adapted to selectively control the positive pressure of the recirculating air in the recirculating airflow pathway, and
the recirculating blower is provided by a variable speed fan device adapted to selectively control the velocity flow of the recirculating air in the recirculating airflow pathway.

56. A portable cleanroom cabinet assembly as defined in claim 55 further including:
a control device electronically coupled to the pressure blower and the recirculating blower to automatically control the relative flow rate outputs thereof.

57. A portable cleanroom cabinet assembly as defined in claim 49 further including:
a distribution device positioned adjacent and proximate to the blower assembly intake portion, and configured to cause the air to be radially drawn into the intake portion from the sides of the distribution device.

58. A portable cleanroom cabinet assembly as defined in claim 42 wherein,
said diffuser plate defines a plurality of air passage apertures extending therethrough, the concentration thereof being less dense proximate to and adjacent the intake portion of the blower assembly.

59. A portable cleanroom cabinet assembly as defined in claim 42 further including:
a shelf positioned in said cavity and configured to extend from one side of said cavity to the other side thereof; and
a bracket device cooperating with said shelf for selective movement of said bracket device between a first stable condition, supportably locking said shelf to the interior walls defining said cavity, and a second stable condition, enabling removal of said shelf from an access opening into said cavity.

60. A portable cleanroom cabinet assembly as defined in claim 59 wherein,
said shelf and said bracket device cooperate to provide a bi-stable, over-center, linkage assembly movable between and biased toward both of:
(i) a first stable condition on one side of a linkage assembly centerline when said bracket device is in said first stable condition; and
(ii) a second stable condition on an opposite side of said centerline when said side bracket device is in said second stable condition.

61. A portable cleanroom cabinet assembly for the transport of at least one component comprising:
a portable cabinet device configured for mobile transport, and defining a cavity formed for receipt of the component therein, said cabinet further defining an airflow pathway extending from an upstream end of said cavity to a downstream end of said cavity;
a filter element positioned in said airflow pathway to filter the air prior to entering said cavity;
a shelf positioned in said cavity and configured to extend from one side of said cavity to the other side thereof; and
a bracket device cooperating with said shelf for selective movement of said bracket device between a first stable condition, supportably locking said shelf to the interior walls defining said cavity, and a second stable condition, enabling removal of said shelf from an access opening into said cavity.

62. A portable cleanroom cabinet assembly as defined in claim 61 wherein,
said shelf and said bracket device cooperate to provide a bi-stable, over-center, linkage assembly movable between and biased toward both of:
(i) the first stable condition on one side of a linkage assembly centerline when said bracket device is in said first stable condition; and (ii) the second stable condition on an opposite side of said centerline when said side bracket device is in said second stable condition.

63. A portable cleanroom cabinet assembly as defined in claim 62 wherein, said cabinet further defining at least one air flow passage having a first opening in flow communication with the upstream end of said cavity, and a second opening in flow communication with the opposite downstream end of said cavity such that substantially all the air flowing through said airflow pathway recirculates through said cavity from said upstream end to said downstream end thereof recirculates back through said air flow passage to said upstream end.

64. A portable cleanroom cabinet assembly as defined in claim 62 wherein, said bracket device includes a first bracket pivotally mounted to the interior wall on one side of said cavity between the first stable condition and the second stable condition, and a second bracket pivotally mounted to the interior wall on the opposite side of said cavity between the first stable condition and the second stable condition.

65. A portable cleanroom cabinet assembly as defined in claim 64 wherein, said linkage assembly includes a first post member mounted to the shelf, and configured to cooperatively couple to the first bracket between the first stable condition and the second stable condition, and a second post member mounted to the shelf, and configured to cooperatively couple to the second bracket between the first stable condition and the second stable condition.

66. A portable cleanroom cabinet assembly as defined in claim 65 wherein, said first bracket defines a first socket formed and dimensioned for receipt of said first post therein in the first stable position, and said second bracket defines a second socket formed and dimensioned for receipt of said second post therein in the first stable position.

67. A portable cleanroom cabinet assembly for the transport of at least one electronic component comprising:

a portable cabinet device configured for mobile transport, and defining a cavity formed for receipt of the at least one air flow passage having a first opening cabinet further defining at least one air flow passage having a first opening in flow communication with an upstream end of said cavity, and a second opening in flow communication with an opposite downstream end of said cavity to define a recirculating airflow pathway such that substantially all the air flowing through said cavity and past said one electronic component from said upstream end to said downstream end thereof recirculates back through said air flow passage to said upstream end;

a filter element positioned in said recirculating pathway to filter the recirculating air prior to entering said cavity;

a blower assembly having an ambient air intake portion in flow communication with the ambient air outside of the recirculating airflow pathway for the intake of the ambient air, a recirculating air intake portion in flow communication with the recirculating air inside the recirculating airflow pathway, and a discharge portion formed to discharge the air drawn in through the intake portions into the recirculating airflow pathway to drive the recirculating air flow; and an adjustable flow device coupled to the ambient air intake portion, and configured to selectively control the intake flow of the ambient air through the ambient air intake portion to variably control the positive pressure of the recirculating air in the recirculating airflow pathway.

68. A portable cleanroom cabinet assembly as defined in claim 67 wherein, said flow device is positioned proximate to and adjacent the ambient air intake portion.

69. A portable cleanroom cabinet assembly as defined in claim 68 wherein, said flow device includes at least one panel member formed and dimensioned to selectively block the ambient air intake portion to impede ambient air flow therethrough.

70. A portable cleanroom cabinet assembly as defined in claim 69 further including:

a pre-filter device coupled to the ambient air intake portion to filter the ambient air before exiting the discharge portion thereof into the recirculating airflow pathway.

* * * * *

UNITED STATES PATENT AND TRADEMARK OFFICE
CERTIFICATE OF CORRECTION

PATENT NO.   : 5,944,602
DATED        : August 31, 1999
INVENTOR(S)  : David A. Grundy It is certified that error appears in the above-identified patent and that said Letters Patent is hereby corrected as shown below:

Column 25, line 46, add the phrase "electronic component therein, said" after the word --one--.

Column 25, line 46, please delete the phrase "air flow passage having a first opening".

Signed and Sealed this

First Day of August, 2000

Attest:

Attesting Officer

Q. TODD DICKINSON
Director of Patents and Trademarks